United States Patent [19]
Sakamoto et al.

[11] Patent Number: 5,285,279
[45] Date of Patent: Feb. 8, 1994

[54] GHOST CANCELLER USING FUZZY CONTROL

[75] Inventors: Toshiyuki Sakamoto, Fujisawa; Tsutomu Noda, Yokohama; Keiro Shinkawa, Hiratsuka, all of Japan

[73] Assignee: Hitachi, Ltd., Tokyo, Japan

[21] Appl. No.: 751,777

[22] Filed: Aug. 29, 1991

[30] Foreign Application Priority Data

Aug. 29, 1990 [JP] Japan ................................. 2-225052

[51] Int. Cl.$^5$ .............................................. H04N 5/21
[52] U.S. Cl. .................................................... 348/614
[58] Field of Search ...................... 358/167, 36, 905; H04N 5/21

[56] References Cited

U.S. PATENT DOCUMENTS

| | | | |
|---|---|---|---|
| 4,389,623 | 6/1983 | Onishi et al. | 358/905 |
| 4,404,600 | 9/1983 | Murakami | 358/905 |
| 4,575,857 | 3/1986 | Murakami | 358/905 |
| 5,144,414 | 4/1992 | Nishi et al. | 358/36 |

FOREIGN PATENT DOCUMENTS

| | | | |
|---|---|---|---|
| 0159885 | 6/1990 | Japan | 358/905 |
| 0137581 | 5/1991 | Japan | 358/905 |

OTHER PUBLICATIONS

Sakurai et al; On the Long Term Instability of Adaptive Filters; 1985; IEEE; Proceedings of ISSA585; pp. 1667-1670.

Primary Examiner—Mark R. Powell
Assistant Examiner—Jeffrey S. Murrell
Attorney, Agent, or Firm—Antonelli, Terry, Stout & Kraus

[57] ABSTRACT

A transmission distortion elimination device for eliminating from a transmitted TV signal, for example, signal distortion such as ghost under fuzzy inferenced control based on an iterative correction method with the capabilities of fast control settling, and a flexible and stable distortion removal operation. The device comprises a filter section for suppressing such transmission distortion as ghost, a controller for controlling the tap coefficients of the filter section, and a fuzzy inference section for receiving distortion information obtained by the controller. The fuzzy inference section iteratively infers and evaluates a correction value of tap coefficients of the filter section. The tap coefficient correction value is determined through fuzzy inference, and the control method for counteracting disturbance coefficients to the control system is described in rules of IF-THEN form based on fuzzy levels, which facilitates the organization of the control algorithm. By the capability of deriving from these rules the correction value which is made continuously variable, the fast control settling, and the stable and flexible transmission distortion elimination operation can be accomplished.

26 Claims, 15 Drawing Sheets

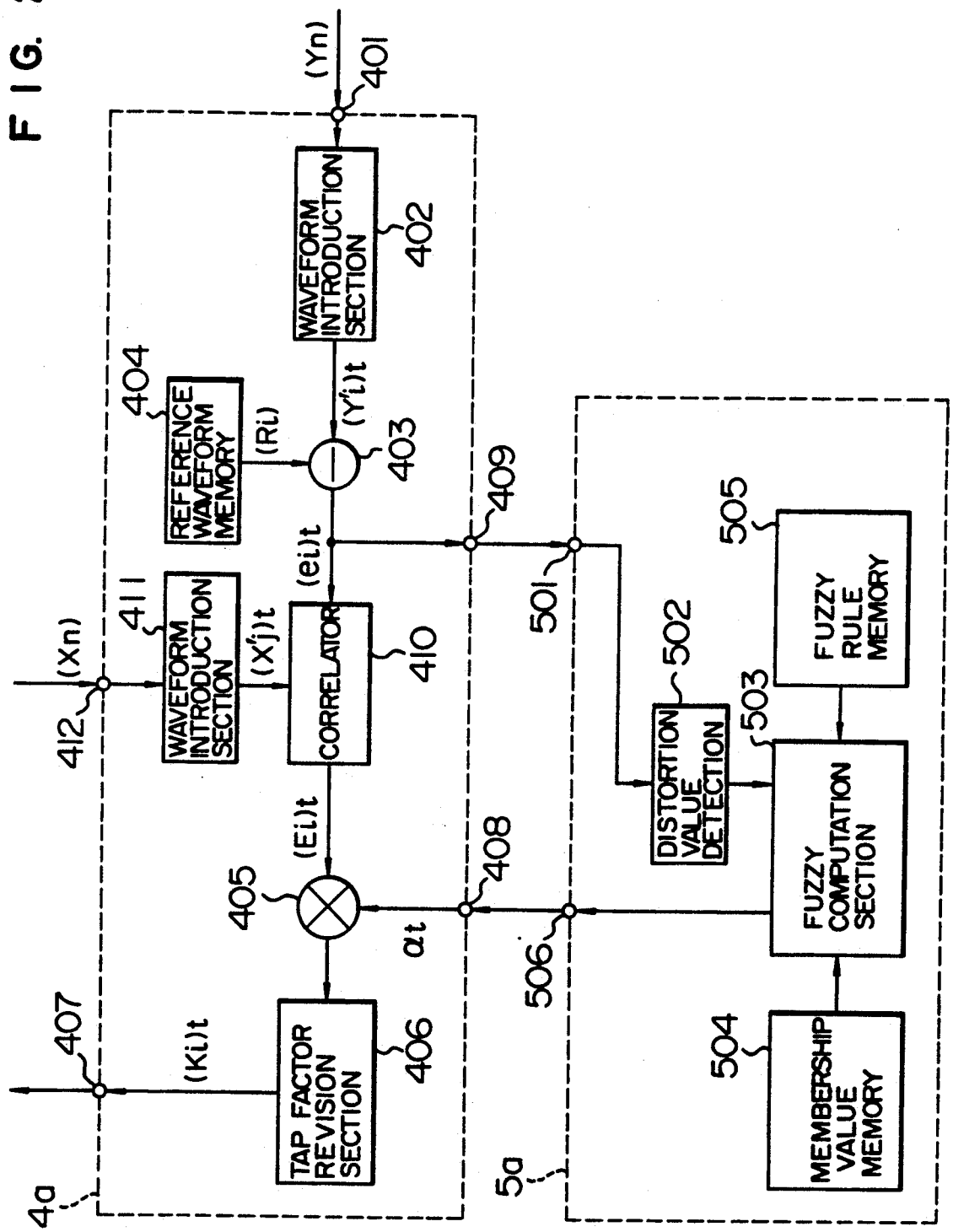

FIG. 4A (RULE 1)
FIG. 4B (RULE 2)
FIG. 4C (RULE 3)

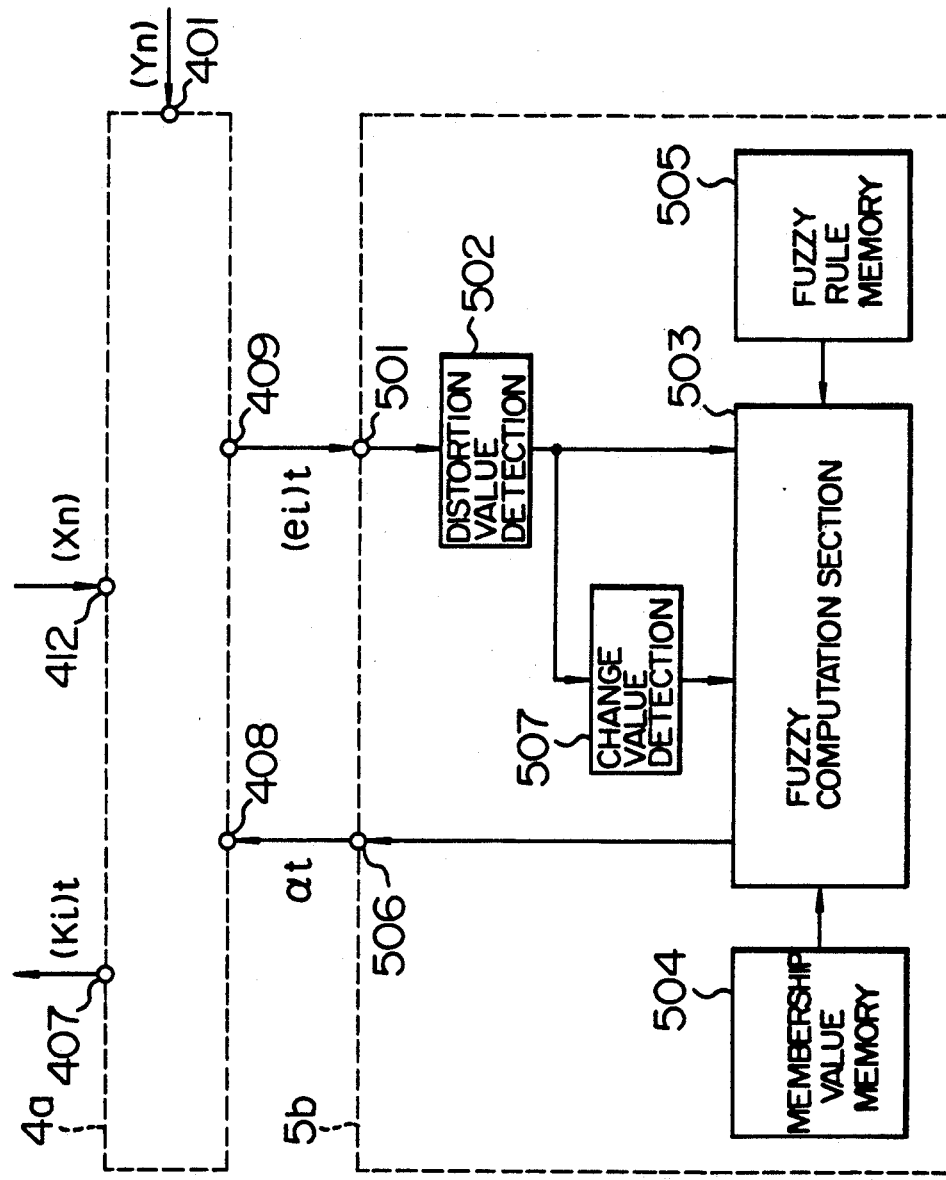
F I G. 5

GHOST CANCELLER USING FUZZY CONTROL

BACKGROUND OF THE INVENTION

This invention relates to transmission distortion elimination devices for removing such distortion of a transmission path as ghost multiplexed with a television signal.

In receiving a television signal broadcasted by a television station, signal distortion of the transmission path caused by reflected waves which are generated by such obstacles as tall buildings and mountains and which are added to the direct wave is called "ghost", and it is a major cause of deteriorated picture quality in ground television broadcasting systems.

As an example of ghost elimination devices intended to remove the ghost, there is known a device which comprises a filter section which generates a ghost component, opposite in polarity to the ghost component added to the signal component, with a transversal filter and adds it to the original signal, and a controller which controls the tap coefficients of the transversal filter of the filter section, as described in the article "Ghost Canceller with GCR signal" of the Television Technology Report, Vol. 13, No. 32, pp. 31-36, published in June 1989.

An example of the method of controlling such tap coefficients by the controller is, as discussed in the above publication, an iterative correction method, in which a reference signal (GCR signal) for transmission distortion detection, such as for ghost, is introduced from the signal produced at the output of the filter section, the difference from a reference waveform which represents the characteristics of an ideal transmission path is evaluated thereby to detect the distortion, and the tap coefficients of the transversal filter are adjusted and corrected iteratively so that the difference becomes minimum.

The iterative correction method has typical algorithms known as MSE (Mean Square Error) method and ZF (Zero Forcing) method, and their tap coefficient correction is based on the following expression.

$$\{Ki\}_t = \{Ki\}_{t-1} - a \cdot \{Ei\}_t \tag{1}$$

where {Ei} is the value of the i-th tap correction:

$$\{Ei\} = e_i \text{ for ZF method,}$$
$$\text{or } \{Ei\} = \sum_k X_{k-1} \cdot e_i \text{ for MSE method,}$$

where $e_i$ is the difference from the reference waveform.

{Ki} is the i-th tap coefficient, t is the number of iteration of correction and a is a constant (0<a<1).

According to the foregoing prior art, the tap coefficient is corrected iteratively in proportion to the amount of distortion (distortion value), and in consequence the tap coefficients which minimize the distortion are set on the transversal filter, whereby the television signal which is rid of such transmission distortion as ghost can be obtained at the output of the filter section. However, in the tap coefficient setting operation which takes place iteratively, an increased feedback value (constant a) at tap coefficient correction incurs the instability of control and susceptibility to such disturbing factors as impulsive noise, although it speeds up the correction, or a decreased feedback value results in an increased number of iteration and thus an extended time for the corrective operation.

SUMMARY OF THE INVENTION

An object of this invention is to provide a transmission distortion elimination device operative on the basis of the iterative correction method to settle fast and stably the elimination control operation for such transmission distortion as ghost stably based.

The above objective is achieved through the provision of a filter section which suppresses at least signal transmission distortion such as ghost, a controller which receives at least the output of the filter section and controls the tap coefficient of the filter section, and a fuzzy inference section which receives at least the distortion information provided by the controller and evaluates the correction value of the tap coefficient from the information through the fuzzy computation.

The controller introduces a reference signal for distortion detection from the output signal of the filter section and evaluates the difference thereof from the reference waveform which represents the characteristics of an ideal transmission path thereby to detect a distortion component added in the transmission path. The fuzzy inference section also evaluates residual distortion value from the distortion information provided by the controller and infers the correction value of the tap coefficient in accordance with the rules of experience which have been set in advance in the IF-THEN form. The result of inference is delivered as a correction coefficient to the controller, which then multiplies the correction coefficient to the tap coefficient correction signal resulting from the ZF method or MSE method and apply the result to the tap coefficients which are currently set to the transversal filter thereby to revise and correctly update the tap coefficients.

Thus the correction value of the tap coefficients is evaluated through fuzzy inference so as to meet a detected condition of distortion, and this enables the control algorithm to include counteractions based on expert's experiences, whereby a fast, stable and flexible transmission distortion eliminating operation can be accomplished.

BRIEF DESCRIPTION OF THE DRAWINGS

FIG. 2 is a block diagram showing, as an example, a specific arrangement of a controller and fuzzy inference section in the inventive transmission distortion elimination device.

FIGS. 4A-4D is a diagram to explain an inference operation.

FIG. 5 is a block diagram of another embodiment of the controller and fuzzy inference section.

DESCRIPTION OF THE PREFERRED EMBODIMENTS

Figure 1:
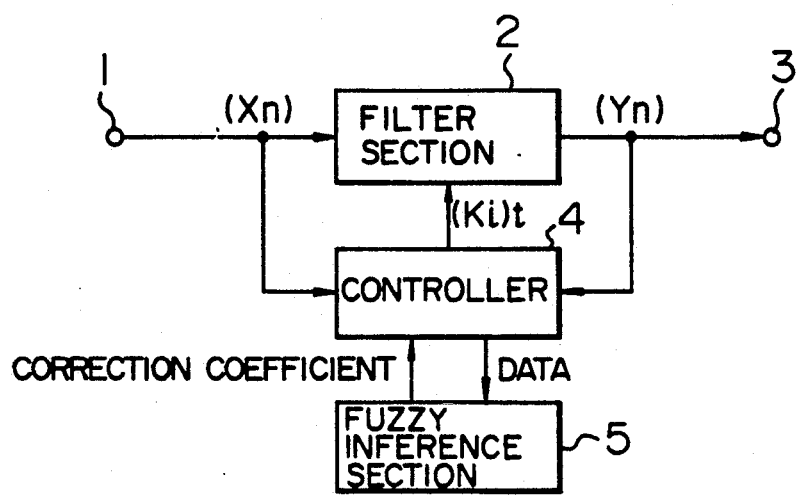
FIG. 1 is a block diagram of the transmission distortion elimination device based on an embodiment of this invention.

In FIG. 1, numeral 1 indicates an input terminal of a television signal, 2 is a filter section, 3 is an output terminal of a television signal, 4 is a controller, and 5 is a fuzzy inference section. The television signal received on the input terminal 1 is fed to the filter section 2. The filter section 2 comprises a non-recursive filter expressed by the transfer function G1(Z) of expression (2), for example, and a recursive filter expressed by the transfer function G2(Z) of expression (3), for example, with their composite transfer function G(Z) being expressed by expression (5).

$$G_1(Z) = k_0 \cdot Z^N + k_1 \cdot Z^{N-1} + \ldots + k_{N-1} \cdot Z^1 + k_N \quad (2)$$

$$G_2(Z) = \frac{1}{1 - G_3(Z)} \quad (3)$$

$$G_3(Z) = k_{N+1} \cdot Z^{-1} + k_{N+2} \cdot Z^{-2} + \ldots + k_{N+M} \cdot Z^{-(N+M)} \quad (4)$$

$$G(Z) = G_1(Z) \cdot G_2(Z) \quad (5)$$

where $Z^{-1} = \exp(-j\omega T)$, T is the tap delay time of transversal filters, and $k_N$ is the tap coefficient of the Nth tap.

A non-recursive filter expressed by the transfer function $G_1(Z)$ is a transversal filter, and it implements gain control of the main signal through the controlled adjustment of tap coefficient $k_N$ and ghost elimination ahead of the main signal through the adjustment of tap coefficients $k_0$ to $k_{N-1}$. A recursive filter expressed by the transfer function $G_3(Z)$ is also a transversal filter, and it implements elimination of such transmission distortion as ghost for the position behind the main signal through the manipulation of tap coefficients $k_{N+1}$ to $k_{N+M}$.

The filter section 2 arranged as described above is controlled for its tap coefficients $k_0$ to $k_{N+M}$ by the controller 4 so as to produce a signal for cancelling the transmission path distortion.

The output of the filter section 2 is delivered to the output terminal 3 and the input of the controller 4. The controller 4 evaluates a set of error signals {ei} with respect to the ideal transmission path based on a set of reference signals {Yn} for distortion elimination which is multiplexed in the television signal provided by the filter section 2, and delivers the result to the fuzzy inference section 5.

The fuzzy inference section 5 includes a parameter extraction section which evaluates such parameters as the amount of distortion and the amount of change from the input error signals {ei}; fuzzy rules which are descriptions in IF-THEN form based on expert's experiences in terms of such ambiguous wording as "large" and "small" about amounts of the parameters; membership values which are qualitative expressions in terms of fuzzy set for the above-mentioned ambiguous words; and a fuzzy computation section. The fuzzy computation section evaluates the grade of matching of a parameter provided by the parameter extraction section thereby to infer the correction value of tap coefficient, so that the result of inference is processed by defuzzification. The resulting of the defuzzification is delivered as a numerical correction coefficient ranging from 0 to 1, for example.

The evaluation of correction coefficient based on the fuzzy computation is made possible through the application of the center of gravity method as a means of defuzzification, specifically the max-min composition method to the inference process, as disclosed in a publication entitled "Base and application of fuzzy theory", written by Sakawa, published in 1989 by Morikita Publication. The correction factor produced by the fuzzy inference section 5 in the manner described above is introduced to the controller 4.

On the other hand, the set of error signals {ei} obtained previously are made to undergo a correlation operation in compliance with the algorithm of the iterative correction method. For example, in the case of the MSE method, the set of reference signals {Xn} for distortion elimination multiplexed in the television signal at the input of the filter section 2 are introduced, and a set of tap correction signals {Ei} for correcting the tap coefficients are obtained from the correlation operation between the reference signals and the set of error signals {ei}. In the case of the ZF method, the error signals {ei} are used intact for the tap correction signals {Ei}, and the reference signals {Xn} are unneeded.

The correction coefficient produced by the fuzzy inference section 5 is multiplied to the amplitude of the tap correction signals. The result of multiplication is added to the tap coefficient which is given to the transversal filter of the filter section 2 so that the tap coefficient is corrected. This process is expressed as follows.

$$\{Ki\}_t = \{Ki\}_{t-1} - \alpha_r \{Ei\}_t \quad (6)$$

where {Ei} is the i-th tap correction value:

$$\{Ei\} = e_i \text{ for ZF method,}$$

$$\text{or } \{Ei\} = \sum_K X_{K-1} \cdot e_i \text{ for MSE method,}$$

where $e_i$ is the difference from the reference waveform. {Ki} is the i-th tap coefficient, t is the number of iteration of correction, and a is a constant (0 < a < 1).

According to this embodiment provided with the fuzzy inference section 5, it is possible to adjust the correction value of tap coefficient to meet the situation of control in response to the membership value and rules established by the designer, such as: "if the distortion value is large and the amount of change is large in the negative direction, then the correction factor is increased slightly" (because of much residual distortion with a trend of decrease), or "if the distortion value is small and its change is negligible, then the correction is made virtually zero" (because of little necessity of further distortion suppression and for the stability of system), or "if the amount of change is large in the positive direction irrespective of the distortion value, then the correction coefficient is made virtually zero" (because of a possible disturbance), whereby the fast-response, stable and flexible transmission distortion elimination operation is accomplished.

The computational processes implemented by the controller 4 and fuzzy inference section 5 are accomplished by combinations of arithmetic and logic operations, and accordingly they can be realized as a software process based on a microprocessor, a hardware process based on a digital circuit, or a combination thereof.

Next, a specific embodiment of the controller 4 and fuzzy inference section 5 which constitute the transmission distortion elimination device will be explained with reference to FIG. 2, FIG. 3 and FIG. 4. FIG. 2 is a block diagram showing the arrangement of the controller 4 and fuzzy inference section 5 in FIG. 1, in which indicated by 4a is a controller, 5a is a fuzzy inference section, 401 is an input terminal for entering the output signal of the filter section 2 to the controller 4a, 402 and 411 are waveform introduction sections, 403 is a subtracter, 404 is a reference waveform memory, 405 is a multiplier, 406 is a tap coefficient revision section, 407 is an output terminal for delivering the tap coefficient to the filter section 2, 408 is an input terminal for receiving a tap coefficient from the fuzzy inference section 5a, 409 is an output terminal for delivering data to the fuzzy inference section 5a, 410 is a correlator, 412 is an input terminal for entering the input signal of the filter section 2 to the controller 4a, 501 is an input terminal for receiving data from the controller 4a, 502 is a distortion value detection circuit for the extraction of parameter, 503 is a fuzzy computation section, 504 is a membership value memory, 505 is a fuzzy rule memory, and 506 is an output terminal for delivering a correction factor to the controller 4a.

FIG. 3 is a set of diagrams showing an example of a membership function stored in the membership value memory 504.

The controller 4a has its input terminal 401 receiving the output signal of the filter section 2, and it is fed to the input of the waveform introduction section 402. The input terminal 412 is supplied with the input signal of the filter section 2, and it is fed to the waveform introduction section 411. The waveform introduction section 402 introduces the reference signals {Yn} for distortion elimination in the output signal of the filter section 2, while the waveform introduction section 412 introduces the reference signals {Xn} for distortion elimination in the signal entered to the filter section 2.

In case the GCR signal described in the aforementioned Television Technology Report, Vol. 13, No. 32 (June, 1989) is applied to the reference signal, the waveform introduction sections 402 and 412 implement computations for decoding the transmission sequence (8-fields sequence) of the introduced GCR signal, and the resulting signal is differentiated (or evaluation of difference) thereby to produce the sinX/X pulse.

The resulting signal includes a noise component as well as the distortion component generated in the transmission path, and if the noise is not suppressed sufficiently, erroneous detection of distortion will result. On this account, the above processed signal is rendered the arithmetic mean process thereby to suppress the noise.

A set of reference signals $\{Y'i\}_t$ resulting from the above process by the waveform introduction section 402 are fed to one input of the subtracter 403. The subtracter 403 has another input supplied with a set of reference waveforms {Ri} read out of the reference waveform memory 404, and it implements subtraction between the {Ri} and the $\{Y'i\}_t$ provided by the filter section 2 to produce a set of error signals {ei}.

The output $\{ei\}_t$ of the subtracter 403 is delivered to one input of the correlator 410 and the output terminal 409. The correlator 410 has another input supplied with a set of reference signals {X'j} provided by the waveform introduction section 412, and it implements the correlation operation between the reference signals {X'j} and error signals $\{ei\}_t$ to produce a set of tap correction signals $\{Ei\}_t$ for the tap coefficient correction.

$$\{Ei\} = \sum_K X_{K-1} \cdot e_i \quad (7)$$

The tap correction signals $\{Ei\}_t$ are fed to one input of the multiplier 405.

The error signals $\{ei\}_t$ produced at the output terminal 409 of the controller 4a are fed through the input terminal 501 of the fuzzy inference section 5a to the distortion value detection circuit 502 for the parameter extraction.

The distortion value detection circuit 502 operates as a parameter extraction means and calculates the square-sum of amplitude values of distortion generated in a signal range defined by the taps of transversal filter forming the filter section 2, thereby evaluating the electrical power of distortion, and delivers the result to the fuzzy computation section 503 as a parameter of measuring the value of distortion caused in the transmission path.

The fuzzy computation section 503 implements the computation for the inference of correction value of the tap coefficient from the distortion value evaluated by the detection circuit 502. This computation uses the membership functions stored in the membership memory 504 and the control rules stored in the fuzzy rule memory 505.

The memory 505 stores the rules of determining the correction value depending on the input distortion value in the IF-THEN description form. Examples of rules for the control of correction factor depending on the detected distortion value based on this embodiment are as follows.

Rule 1: If distortion value is small, then correction coefficient is decreased.

Rule 2: If distortion value is medium, then correction coefficient is made medium.

Rule 3: If distortion value is large, then correction coefficient is increased.

Figure 3A:
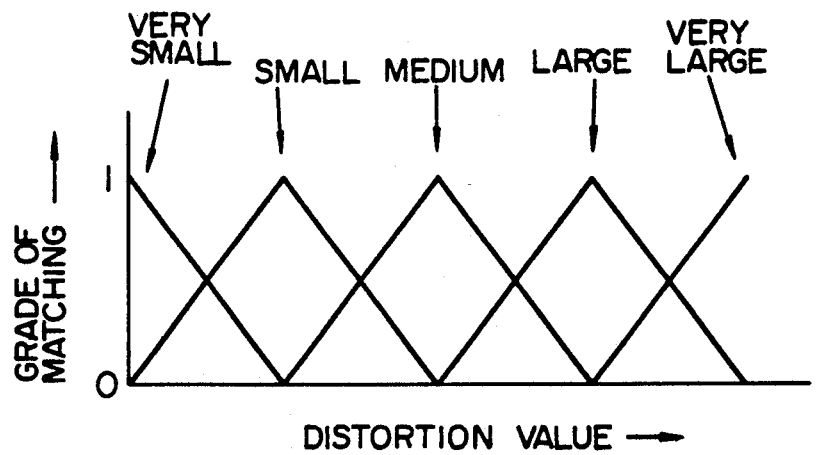
FIGS. 3A and 3B is a set of diagrams showing a specific example of a membership function applicable to the example of FIG. 2.
Figure 3B:
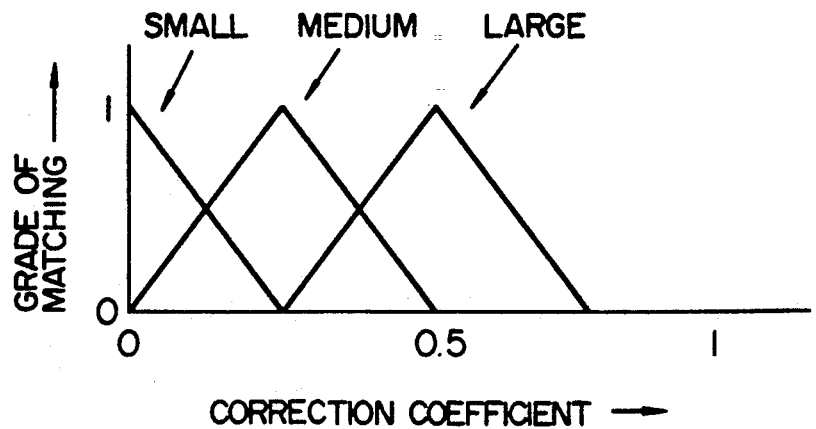

The membership memory 504 stores membership functions which represent the grade of matching in numeric values in terms of fuzzy set for such ambiguous wording (fuzzy level) as "large" and "small" used in the IF (condition part) and THEN (operation part) of the descriptive rules. FIG. 3 shows an example of membership functions, of which shown by FIG. 3A is a membership function indicating the grade of matching of each of five fuzzy levels for the condition part and shown by FIG. 3B is a membership function indicating the grade of matching of each of three fuzzy levels for the operation part. These graphs have plots of the grade of matching on the vertical axis with the numeric value on the horizontal axis.

The fuzzy computation section 503 invokes the IF-THEN rules stored in the fuzzy rule memory 505, introduces a membership function expressed in such a fuzzy level as "large" described in the rule from the membership value memory 504, evaluates the grade of matching between the membership value in the condition part of each rule and the detected distortion value, and determines the probability of adoption of the operation part on the basis of the grade of matching. For example, in the case of the above-mentioned rule 1, the fuzzy computation section 503 evaluates the value of intersection between the membership function indicative of fuzzy level "small" and the distortion value evaluated by the distortion value detection circuit 502, as shown in FIG. 4A, and slices the membership function of fuzzy level "small" in the operation part at the value of the intersection (hatched portion), and the probability of adoption of the operation part is determined. The rule 2 and rule 3 are processed in the same manner, with results being obtained as shown in FIGS. 4B and 4C, respectively.

Figure 4D:
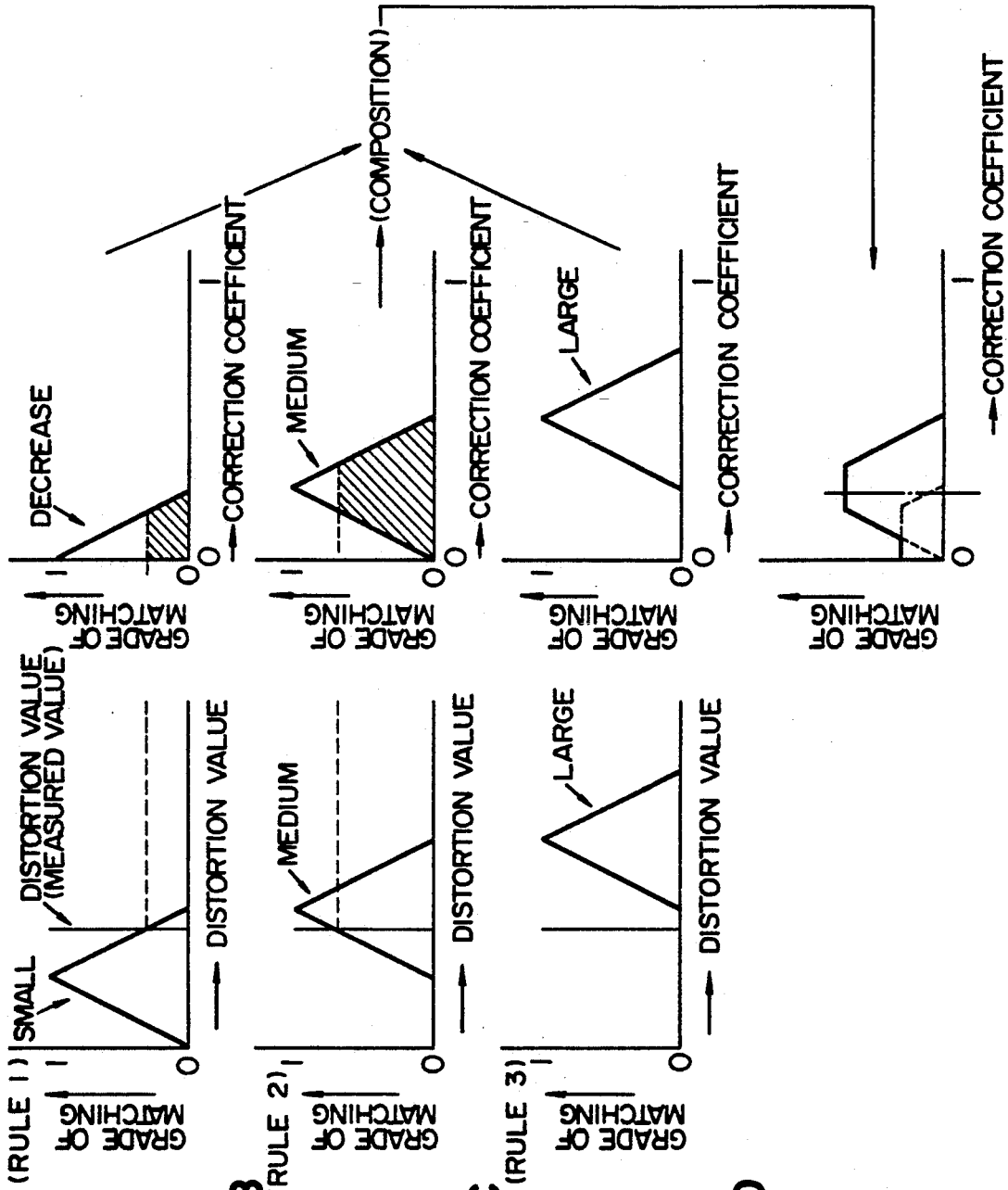

The results of inference for all rules are merged by superimposition as shown in FIG. 4D, thereby obtaining the final result. The result in the form of a fuzzy set cannot settle the correction value of tap coefficient by itself, and therefore defuzzification conversion is implemented thereby to settle the correction value. The defuzzification is carried out by obtaining a point (center of gravity) through which a vertical line passes to halve the area defined by the membership function that represents the final result, for example, on the graphic plane.

The fuzzy computation section 503 delivers the settled correction value of tap coefficient as a correction factor $\alpha_t$, and it is sent from the output terminal 506 of the fuzzy inference section 5a to another input of the multiplier 405 by way of the input terminal 408. Consequently, the multiplier 405 produces on its output the amplitude value of the tap correction signals $\{Ei\}_t$ provided by the correlator 410 multiplied by the correction coefficient $\alpha_t$, and result of the multiplication is fed to the input of the tap coefficient revision section 406.

The tap coefficient revision section 406 preserves the tap coefficient $\{Ki\}_{t-1}$ of the (t−1)-th correction, and the t-th tap coefficient revision is implemented by adding the $\alpha_t\{Ei\}_t$ produced by the multiplier 406 to the $\{Ki\}_{t-1}$. The revised tap coefficient $\{Ki\}_t$ is delivered to the transversal filter which forms the filter section 2 by way of the output terminal 407 of the controller 4a.

According to this embodiment, it becomes possible to establish control rules for values of distortion caused in the transmission path and values of residual distortion left in the preceding elimination process, and to control the ghost elimination process based on the control rules. For example, by establishing the rule as mentioned above, it is possible to have a control such that in dealing with a large distortion, the correction value for each revision is increased so that the number of revision iteration needed for the settlement is reduced thereby to minimize the settling time, and in dealing with a small distortion, the correction value is decreased so that the device operation stability is enhanced.

Although the above embodiment has been explained for the case of three control rules, with the condition part being of five fuzzy levels and the operation part being of three fuzzy levels, this invention is not confined to these numbers and the form of membership functions. Although the above explanation is the case of the max-min composition method for inference and the center of gravity method for defuzzification conversion, other inference method such as the algebraic product-sum method and other defuzzification method such as the height method can also be applied.

Figure 14:
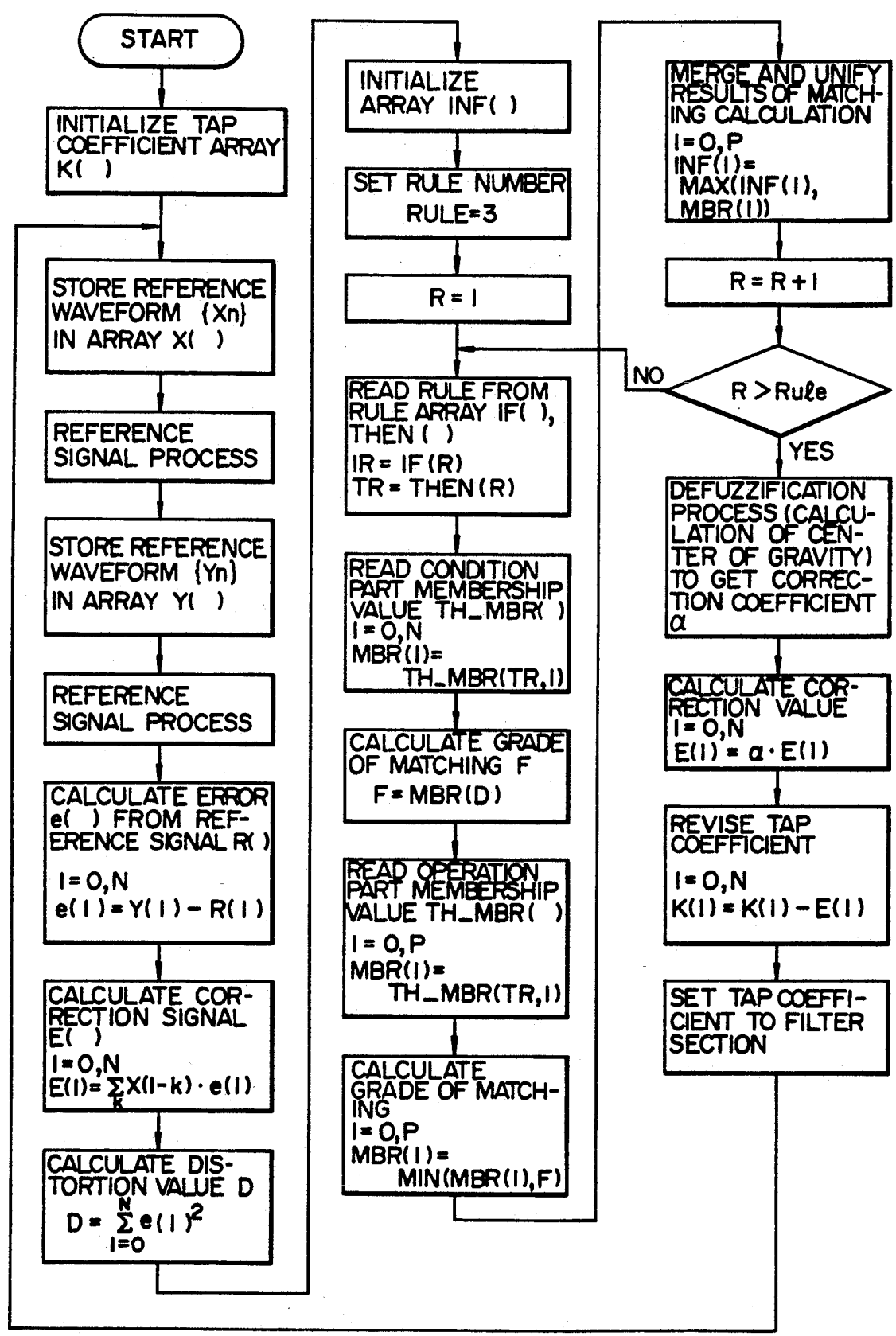
FIG. 14 is a flowchart showing the operation of the embodiment of FIG. 2.

The above embodiment can be carried out in the form of software which operates as shown by the flowchart of FIG. 14 for example.

Next, another embodiment of the controller 4 and fuzzy inference section 5, which form the transmission distortion elimination device of FIG. 1, will be described with reference to FIG. 5. In the figure, indicated by 5b is a fuzzy inference section, 507 is a change value detection circuit for detecting change of distortion amount, and the rest are the same as the preceding embodiment.

The reference signals {Yn}, which are multiplexed with the output signal of the filter section 2 received on the input terminal 401 of the controller 4a, are introduced by the waveform introduction section 402, and error signals $\{ei\}_t$ are detected by the subtracter 403, as in the preceding embodiment. The error signals $\{ei\}_t$ are delivered to one input of the correlator 410 and the output terminal 409. The error signals $\{ei\}_t$ on the output terminal 409 of the controller 4a are supplied to the distortion value detection circuit 502 by way of the input terminal 501 of the fuzzy inference section 5b.

The distortion value detection circuit 502 calculates the square-sum of amplitude values of distortion in a signal range defined by the taps of transversal filter forming the filter section 2, and thereby evaluates the amount of distortion in the range. The result of calculation is fed to the fuzzy computation section 503 and the change value detection circuit 507 for the parameter extraction. The detection circuit 507 evaluates the difference between the amount of distortion calculated at the time of previous correction and the amount of distortion calculated at present, and delivers the result to the fuzzy computation section 503.

In this embodiment, the condition part of a rule has two parameters (distortion value and amount of change of distortion), and when the rule is described, these parameters are connected in the form of AND logic (e.g., "if A is large and B is large, then C is decreased"). The fuzzy computation section 503 evaluates the grade of matching between the detected parameters and membership value, and determines the smaller to be the grade of matching of the operation part (max-min composition method).

From the grade of matching obtained in this manner, results of inference are produced, and the final conclusion is obtained by merging these results and the correction value of tap coefficient is settled through defuzzification conversion, as in the preceding embodiment.

The fuzzy computation section 503 delivers the settled correction value of tap coefficient as a correction coefficient $\alpha_t$, and it is multiplied to the amplitude values of tap correction signals {Ei} by the multiplier 405. The result of multiplication is fed to the tap coefficient revision section 406, and the tap coefficient is revised.

This embodiment enables the organization of fuzzy control rules for the elimination of a main distortion generated in the transmission path and for the further elimination residual distortion and the amount of distortion change during these elimination processes and enables the control of the ghost elimination operation based on the rules. For example, it is possible to establish rules which are responsive to the condition of disturbance depending on the amount of change, such as: "if the distortion value is large and the amount of change is large in the negative direction, then the correction coefficient is increased slightly" (because of much residual distortion with a trend of decrease), or "if the distortion value is small and its change is negligible, then the correction coefficient is made virtually zero" (because of little expectation of further distortion suppression and for the stability of the device), or "if the amount of change is large in the positive direction irrespective of the distortion value, then the correction coefficient is made virtually zero" (because of possible disturbances).

Figure 6:
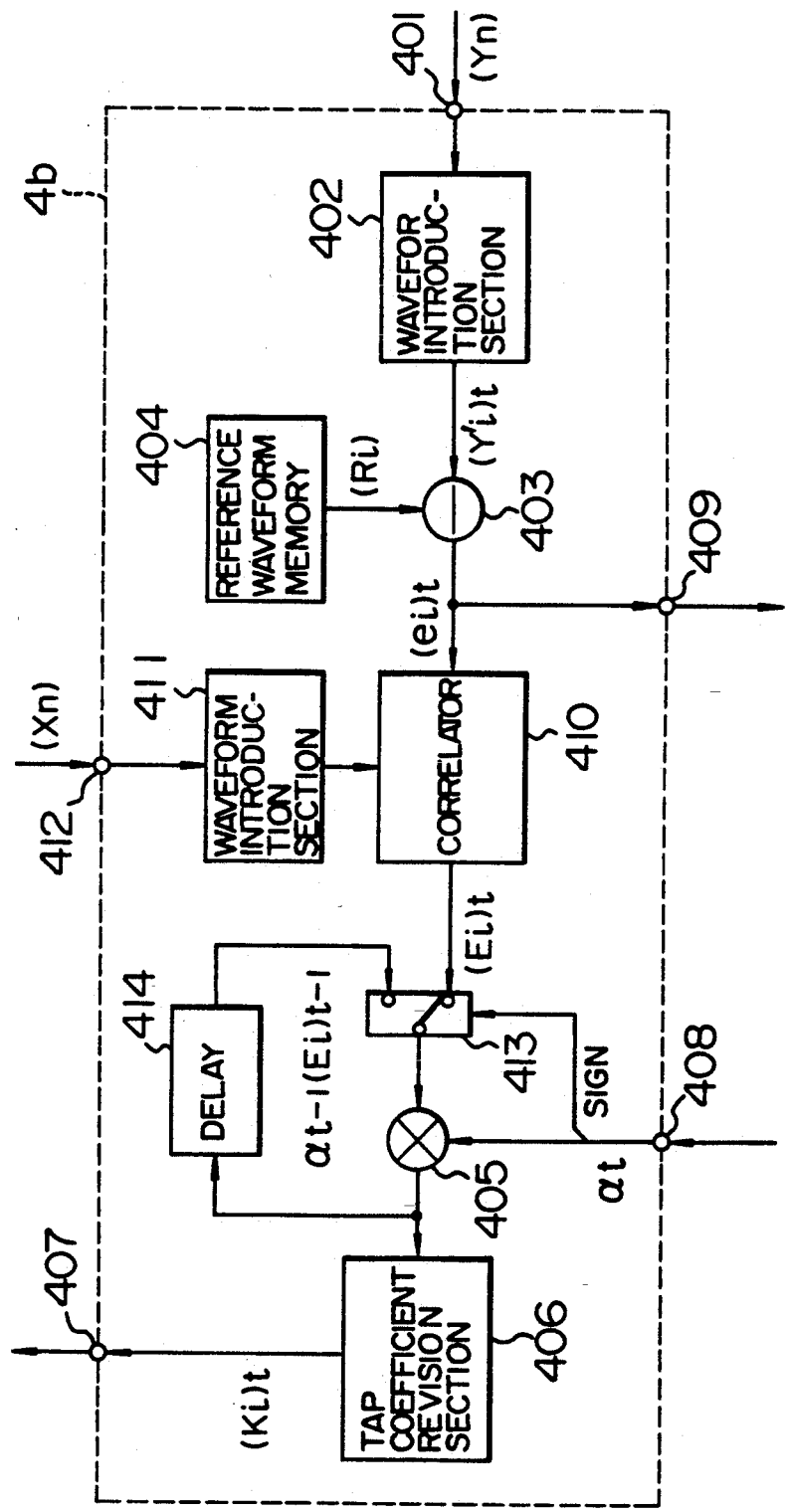
FIG. 6 is a block diagram of still another embodiment of the controller.

With reference to FIG. 6, next explained is means of tap coefficient correction for the case of the inference result provided by the fuzzy inference section 5b having a settled value (correction coefficient $\alpha_t$) in a range from $-1$ to 1.

In the figure, indicated by 4b is a controller, 413 is a switch circuit, 414 is a delay circuit, and the rest are the same as the preceding embodiment.

The correlator 410 has its output supplied to one input of the switch circuit 413. The output of the switch circuit 413 is supplied to one input of the multiplier 405, which has another input supplied with the numerical correction coefficient $\alpha_t$ ranging from $-1$ to 1 entered through the input terminal 408. The output of the multiplier 405 is fed to the inputs of the tap coefficient revision section 408 and delay circuit 414. The delay circuit 414 operates to deliver the correction value $\alpha_{t-1}\cdot\{Ei\}_{t-1}$ of the previous tap coefficient to another input of the switch circuit 413. The switch circuit has its control terminal supplied with the sign of the correction coefficient $\alpha_t$, and it directs the output of the delay circuit 414 or the output of the ghost detection section 403 to the multiplier 405 in response to a negative sign or a positive sign, respectively.

According to this embodiment, in case the distortion has increased as a result of the previous correction, it becomes possible to modify the previous correction value by setting the rule and membership value so that the inference result settles to a negative value. For example, by setting rules such as: "if the distortion value is large and the amount of change is large in the negative direction, then the correction coefficient is increased slightly in the positive direction (because of much residual distortion with a trend of decrease), or "if the distortion value is small and its change is negligible, then the correction coefficient is made virtually zero" (because of little necessity of further distortion elimination and for the device stability), or "if the amount of change is large in the positive direction irrespective of the distortion value, then the correction coefficient is increased in the negative direction" (because of a possible disturbance), whereby the possibility of incorrect (n−1)-th correction due to disturbance can be judged from the amount of change of distortion and it can be corrected at the t-th correction.

Figure 7:
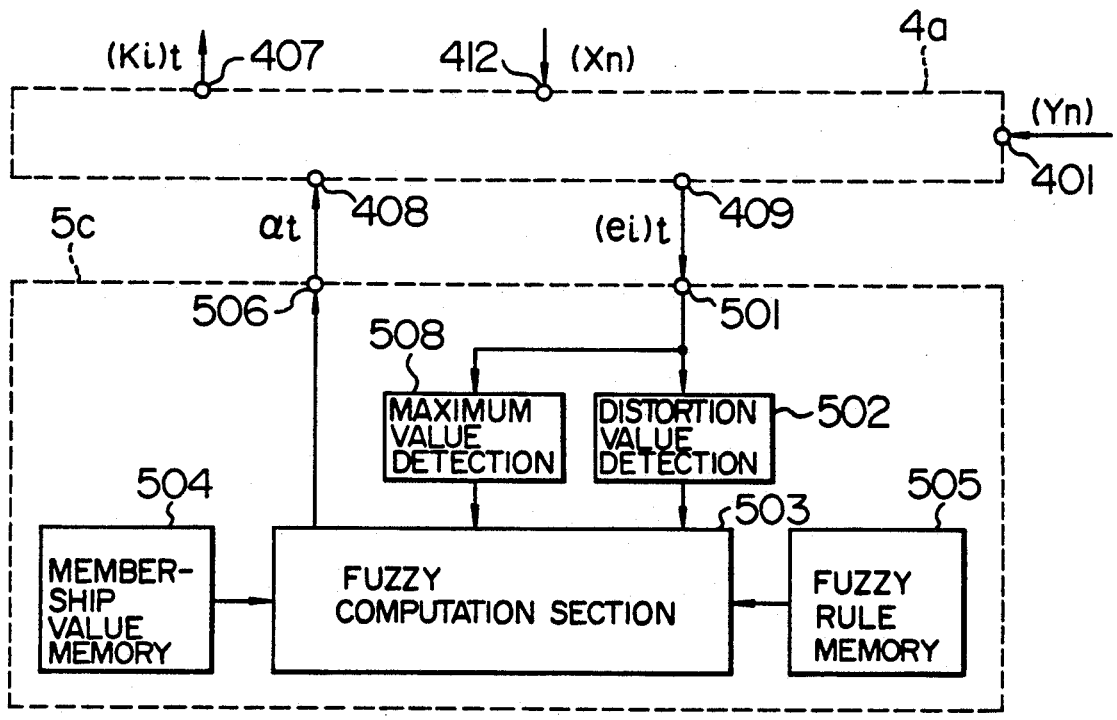
FIGS. 7 to 13 are block diagrams of still further embodiments of the controller and fuzzy inference section, respectively.

Next, still another embodiment of the controller 4 and fuzzy inference section 5, which form the transmission distortion elimination device of FIG. 1, will be described with reference to FIG. 7. In the figure, indicated by 5c is a fuzzy inference section, 508 is a maximum value detection circuit for parameter extraction, and the rest are the same as the preceding embodiment.

The error signals $\{ei\}_t$ detected by the controller 4a are fed to the inputs of the distortion value detection circuit 502 and maximum value detection circuit 508 by way of the input terminal 501 of the fuzzy inference section 5c, as in the previous embodiment.

The maximum value detection circuit 508 detects the maximum value of amplitude values of distortion in a signal range defined by taps of the transversal filter forming the filter section 2, and delivers the result of the detection to the fuzzy computation section 503.

The distortion value detection circuit 502 has its output fed to the input of the fuzzy computation section 503.

The fuzzy computation section 503 reads out each of the control rules stored in the fuzzy rule memory 505, as in the previous embodiment, introduces from the membership value memory 504 a membership value expressed by fuzzy set for the meaning of such ambiguous wording as "large" described in each rule, and implements each inference based on the max-min composition method and non-fuzzy conversion based on the center of gravity method, for example.

The fuzzy computation section 503 delivers the correction value of a tap coefficient settled by defuzzification conversion as a correction coefficient $\alpha_t$, and it is multiplied to the amplitude value of the tap correction signal $\{Ei\}_t$ by the multiplier 405. The result of the multiplication is fed to the tap coefficient revision section 406, and the tap coefficient is revised.

This embodiment enables the organization of control rules for values of distortion generated in the transmission path and for values of residual distortion and the maximum value of distortion during the elimination process, and the control of the ghost elimination operation based on the rules. For example, it is possible to establish rules for the correction of detection sensitivity of distortion value depending on the maximum value, such as: "if the distortion value is large and the maximum value is large, then the correction factor is increased slightly" (because of high distortion detection sensitivity due to high distortion peak), or "if the distortion value is large and the maximum value is small, then the correction coefficient is decreased" (because of low detection sensitivity due to low distortion peak and high possibility of inclusion of much noise in the obtained distortion value).

Figure 8:
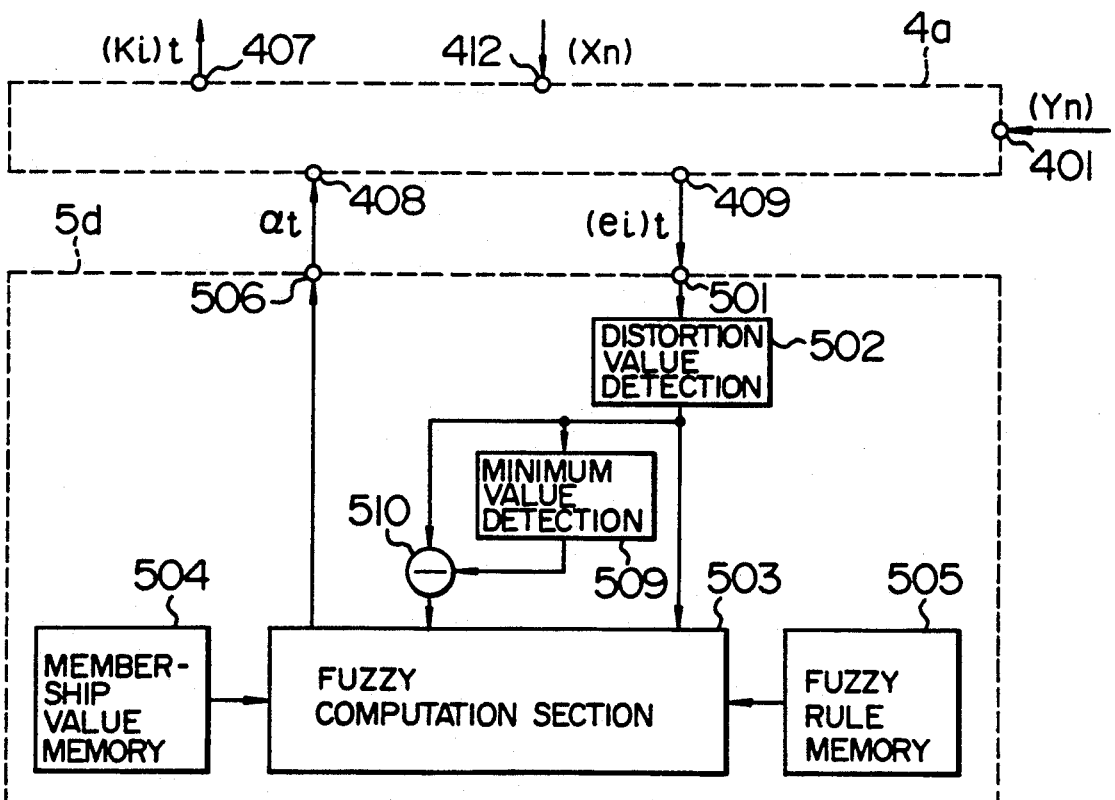

Next, another embodiment of the controller 4 and fuzzy inference section 5, which form the transmission distortion elimination device of FIG. 1, will be described with reference to FIG. 8. In the figure, indicated by 5d is a fuzzy inference section, 509 is a minimum distortion value selection circuit, and the rest are the same as the preceding embodiment.

The error signals $\{ei\}_t$ detected by the controller 4a are fed through the input terminal 501 of the fuzzy inference section 5d to the distortion value detection circuit 502 for parameter extraction, and its output is fed to one input of the minimum value selection circuit 509 and the input of the fuzzy computation section 503.

The selection circuit 509 compares the input distortion value with a minimum distortion value in the past thereby to select the smaller one, and delivers the result to another input of the subtracter 510 and stores as the minimum distortion value.

The subtracter 510 evaluates the difference between the distortion value obtained by the circuit 502 and the minimum distortion value selected by the circuit 509, and delivers the result to the fuzzy computation section 503.

The section 503 reads out the control rules stored in the fuzzy rule memory 505, as in the previous embodiment, introduces from the membership value memory 504 a membership value expressed by fuzzy set for the meaning of such ambiguous wording as "large" described in the rule, and implements inference based on the maxmin composition method and defuzzification based on the center of gravity method, for example.

The fuzzy computation section 503 delivers the correction value of tap coefficient settled by defuzzification as a correction coefficient $\alpha_t$, and it is multiplied to the amplitude value of the tap correction signals $\{Ei\}_t$ by the multiplier 405. The result of multiplication is fed to the tap coefficient revision section 406, and the tap coefficient is revised.

This embodiment enables the production or organization of various control rules for values of distortion involved in the transmission path, for values of residual distortion after the preceding eliminations, and for the difference between a minimum distortion value detected in the process of ghost elimination operation and the present distortion value, and enables the control of the ghost elimination operation according to the produced rules. For example, it is possible to establish rules for inferring the stability of the control system, such as: "if the distortion value is large and the difference from the minimum distortion value is virtually zero, then the correction coefficient is increased in the positive direction", or "if the distortion value is small and the difference from the minimum distortion value is virtually zero, then the correction coefficient is made virtually zero", or "if the difference from the minimum distortion value is large irrespective of the distortion value, then the correction coefficient is made virtually zero" (because of high possibility of divergence or erroneous detection of distortion).

It is also possible to organize such rules by supplying the output of the minimum value selection circuit 509, in place of the output of the subtracter 510, to the fuzzy computation section 503, and in this case similar control is possible based on such a rule as "if the distortion value is large and the minimum value of distortion is small, then the correction coefficient is made virtually zero".

Also in this embodiment, it is possible to accomplish the similar control as the embodiment of FIG. 6 through the establishment of rules and membership values so that the correction coefficient $a_t$ ranges from $-1$ to 1 and the application of the tap coefficient correction means shown in FIG. 6. For example, it is possible to determine the possibility of error in the $(t-1)$-th correction due to disturbance by checking the minimum distortion value and present distortion value and to correct such error at the n-th correction by setting rules such as "if the distortion value is large and the difference from the minimum distortion value is virtually zero, then the correction coefficient is increased in the positive direction", or "if the distortion value is small and the difference from the minimum distortion value is virtually zero, then the correction coefficient is made virtually zero", or "if the difference from the minimum distortion value is large irrespective of the distortion value, then the correction coefficient is increased in the negative direction" (because of high possibility of divergence or erroneous detection of distortion).

Figure 9:
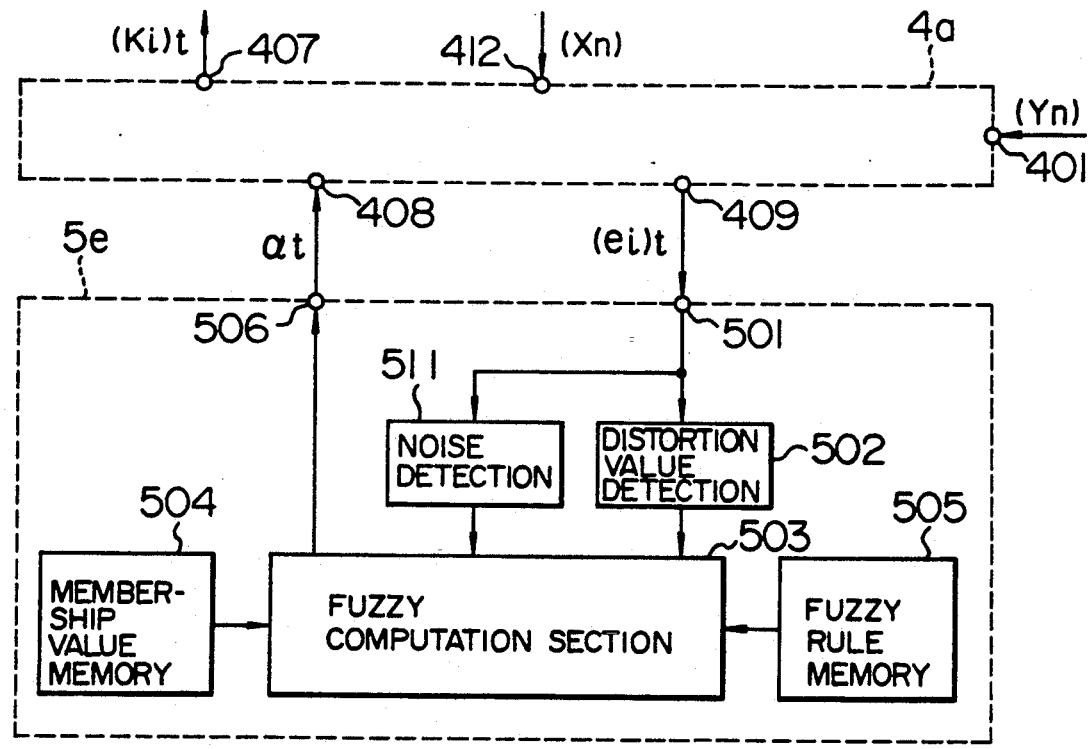

Next, another embodiment of the controller 4 and fuzzy inference section 5, which form the transmission distortion elimination device of FIG. 1, will be described with reference to FIG. 9. In the figure, indicated by 5e is a fuzzy inference section, 511 is a noise detection circuit for parameter extraction, and the rest are the same as the preceding embodiment.

The error signals $\{ei\}_t$ detected by the controller 4a are fed through the input terminal 501 of the fuzzy inference section 5e to the distortion value detection circuit 502 for the parameter extraction, and its output is fed to the input of the fuzzy computation section 503.

The noise detection circuit 511 extracts a noise component included in the error signals $\{ei\}_t$. Based on the fact that the distortion in the error signals $\{ei\}_t$ are caused with a correlation therebetween while their noise is not caused with such a correlation, the noise can be detected by introducing error signals $\{ei\}_{t-1}$ and $\{ei\}_t$, for example and evaluating the difference of them.

Such detected noise components are processed to form their square-sum or absolute-value sum over the range of "i" with which the distortion value is detected, and the result is delivered to the fuzzy computation section 503 as a noise value accompanying with the error signals $\{ei\}_t$.

The fuzzy computation section 503 reads out each of the control rules stored in the fuzzy rule memory 505, as in the previous embodiment, introduces from the membership value memory 504 a membership value expressed by fuzzy set for the meaning of ambiguous wording such as "large" described in each rule, and implements a respective inference based on the max-min composition method and defuzzification based on the center of gravity method, for example.

The fuzzy computation section 503 delivers the correction value of tap coefficient settled by the defuzzification as a correction coefficient $a_t$, and it is multiplied to the corresponding amplitude value of tap correction signals $\{Ei\}_t$ by the multiplier 405. The result of multiplication is fed to the revision section 406, and the tap coefficient is revised.

This embodiment enables the organization of control rules for values of distortion involved in the transmission path, for values of residual distortion after the preceding eliminations and for such noise values, and enables controls of the ghost elimination operation based on the rules. For example, it is possible to establish rules for the correction of distortion detection sensitivity which is to be corrected depending on the noise value, such as: "if the distortion value is large and the noise value is small, then the correction coefficient is increased slightly" (because of high reliability of the detected distortion value owing to little noise), or "if the distortion value is large and the noise is much, then the correction coefficient is decreased" (because of low reliability of detected distortion value due to much noise).

Figure 10:
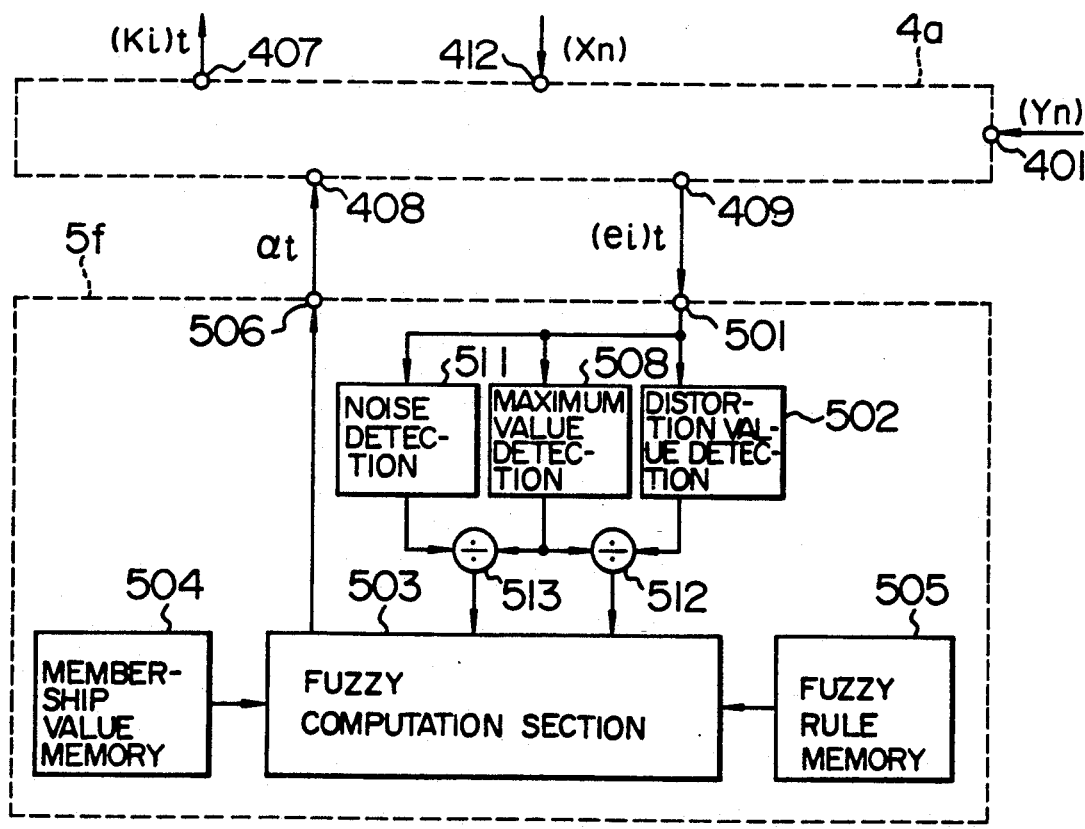

Next, another embodiment of the controller 4 and fuzzy inference section 5, which form the transmission distortion elimination device of FIG. 1, will be described with reference to FIG. 10. In the figure, indicated by 5f is a fuzzy inference section, 512 and 513 are dividers, and the rest are the same as the preceding embodiment.

The error signals $\{ei\}_t$ detected by the controller 4a are fed through the input terminal 501 of the fuzzy inference section 5f to the distortion value detection circuit 502 for parameter extraction, noise detection circuit 511 and maximum detection circuit 508.

The divider 512 receives the outputs of the detection circuits 502 and 508, and operates to divide the maximum distortion value by the effective value of distortion so as to evaluate their ratio. Since the maximum distortion value and the effective value of distortion are virtually equal in the case of a single distortion being involved and since the effective value is larger than the maximum value in the case of multiple distortions being involved, their ratio can be used as a parameter indicative of the state of involved distortion. The divider 513 receives the outputs of the detection circuits 511 and 508, and operates to divide the effective value of the detected noise by the detected maximum distortion value so as to evaluate their ratio. Since the maximum distortion value is larger than the effective value of the noise in the case of clear difference existing between the distortion and the noise and since the maximum distortion value is virtually equal in the case of clear distinction hardly existing between them, their ratio can be used as a parameter indicative of easiness or hardness of control. The dividers 512 and 513 have their outputs delivered to the input of the fuzzy computation section 503.

The fuzzy computation section 503 reads out each of the control rules stored in the fuzzy rule memory 505, as in the previous embodiment, introduces from the membership value memory 504 a membership value expressed by fuzzy set for the meaning of such ambiguous wording as "large" described in each rule, and implements the respective inference based on the max-min composition method and defuzzification based on the center of gravity method, for example.

The fuzzy computation section 503 delivers the correction value of tap coefficient settled by the defuzzification as a correction coefficient $\alpha_t$, and it is multiplied to the corresponding amplitude value of tap correction signals $\{Ei\}_t$ by the multiplier 405. The result of multiplication is fed to the tap coefficient revision section 406, and the tap coefficient is revised.

This embodiment enables the organization of control rules in consideration of the state of distortion generated in the transmission path and the easiness of control, and enables the control of the ghost elimination operation based on these rules. For example, it is possible to establish rules which are responsive to the state of distortion and the easiness of control, such as: "if distortion is of single and control is easy, then the correction coefficient is increased slightly", or "if distortion is of multiple and control is difficult, then the correction coefficient is increased slightly", or "if control is difficult irrespective of the state of distortion, then the correction coefficient is made virtually zero".

In addition, according to this embodiment, the evaluation of ratio enables the reduction in the number of parameters entered to the fuzzy computation section 503 from three to two and thus the reduction in the number of rules to be established, whereby the process time expended for inference can be reduced.

In case the inference time does not matter, the outputs of the distortion value detection circuit 502, maximum value detection circuit 508 and noise detection circuit 511 may be fed directly to the fuzzy computation section 503 in accomplishing the similar process through the establishment of rules, and in this case the dividers 512 and 513 for the evaluation of ratios can be eliminated.

Next, another embodiment of the controller 4 and fuzzy inference section 5, which form the transmission distortion elimination device of FIG. 1, will be described with reference to FIG. 11. In the figure, indicated by 4c is a controller, 5g is a fuzzy inference section, 415 is a switch circuit, 416 is a comparator, 514 is a minimum value selection circuit and 515 is a subtracter. Indicated by 417-419 are an example of components which constitute the section 406, of which 417 is a subtracter, 418 is a delay circuit, 419 is a base clip circuit, and the rest are the same as the preceding embodiments.

The error signals $\{ei\}_t$ detected by the controller 4c are fed to one input of the correlator 410 and to the input terminal 501 of the fuzzy inference section 5g by way of the output terminal 409 of the controller 4c, as in the preceding embodiments.

The correlator 410 operates identically to the preceding embodiments to deliver a set of tap correction signals $\{Ei\}_t$ to one output of the switch circuit 415 and its output connected to one input of the subtracter 417 which forms the revision section 406. The output of the subtracter 417 is connected to the output terminal 407 of the controller and the input of the delay circuit 418.

The base clip circuit 419 has a characteristics of a function f(x) of the following expression (8), and it implements zero-clipping for near-zero values of the tap coefficient $\{Ki\}_{t-1} (-1 < Ki < 1)$ provided by the delay circuit 418. The circuit 419 has its base clip width varied depending on the level of a signal $\beta_t$ ($0 \leq \beta_t \leq 1$) which is applied to the control terminal.

$f(x)=0$ for $|x|<\beta_t$, or $f(x)=x$ for $|x| \geq \beta_t$ \hfill (8)

The output of the base clip circuit 419 is connected to another input of the subtracter 417, and its control terminal is connected to the input terminal 408 of the controller 4c to receive the control signal $\beta_t$. The control signal $\beta_t$ applied to the input terminal 408 is also fed to one input of the comparator 416. The comparator 416 has another input given constant S ($0 \leq S \leq 1$), with its output connected to the control terminal of the switch circuit 415. The switch circuit 415 has its inputs given constant a ($0<a<1$) and 0 (zero).

The comparator 416 compares the control signal $\beta_t$ with the constant S, and it operates on the switch circuit 415 to select the constant 0 (zero) if the control signal $\beta_t$ is greater than the constant S, or otherwise select the constant a.

The error signals $\{ei\}_t$ produced on the output terminal 409 of the controller 4c are fed to the distortion value detection circuit 502 and noise detection circuit 511 for the parameter extraction by way of the input terminal 501 of the fuzzy inference section 5g. The distortion value detection circuit 502 has its output fed to the input of the minimum value selection circuit 509 and one input of the subtracter 510.

The minimum value selection circuit 509 compares the incoming distortion value with the minimum distortion value in the past, and it delivers the smaller to another input of the subtracter 510 and also stores the smaller as the minimum distortion value.

The subtracter 510 evaluates the difference between the distortion value detected by the distortion value detection circuit 502 and the minimum distortion value selected by the minimum value selection circuit 509, and delivers the result to the fuzzy computation section 503.

The noise detection circuit 511 has its output fed to the input of the minimum value selection circuit 514 and one input of the subtracter 515. The minimum value selection circuit 514 compares the incoming noise value with the minimum noise value in the past, and it delivers the smaller to another input of the subtracter 515 and also stores the smaller as the minimum noise value. The subtracter 515 evaluates the difference between the noise value provided by the noise detection circuit 511 and the minimum noise value provided by the minimum value selection circuit 514, and delivers the result to the fuzzy computation section 503.

The fuzzy computation section 503 reads out each of the control rules stored in the fuzzy rule memory 505, as in the previous embodiments, introduces from the membership value memory 504 a membership value expressed by fuzzy set for the meaning of such ambiguous wording as "large" described in each rule, and implements each inference based on the max-min composition method and defuzzification based on the center of gravity method, for example. The fuzzy computation section 503 delivers the control signal $\beta_t$ settled by the defuzzification to the input terminal 408 of the controller 4c.

This embodiment is intended to prevent divergence of the distortion removal control operation which may otherwise diverge in unstable controlled states. In the event, signal oscillation states arise to mix oscillated signals with the error signals $\{ei\}_t$, resulting in a detected distortion value or noise value in excess of their normal minimum values. Among tap coefficients revised with control operations of such divergence trend a random phase pattern of tap coefficients may exists which are of relatively small values resulting from noise or the like.

According to this embodiment, the fuzzy inference section 5g determines the magnitude of a control signal $\beta_t$ necessary to cancel such a random phase tap coefficient and the control signal is used to control the base clip circuit 419 so that the random tap coefficient is cancelled thereby to prevent the divergence through the establishment of control rules, such as: "if distortion much increases relative to its minimum value and noise much increases relative to its minimum value, then control signal $\beta_t$ is increased", or "if distortion increases moderately relative to its minimum value and noise increases moderately relative to its minimum value, then control signal $\beta_t$ is made moderate", or "if distortion does not virtually increase relative to its minimum value and noise does not virtually increase relative to its minimum value, then the control signal is made virtually zero".

The control signal $\beta_t$ is converted into a bi-level signal by the comparator 416 and used to control the switch circuit 415 to provide a zero coefficient to the multiplier 405 so that tap coefficient revision does not take place. Accordingly, it is possible to prevent the tap correction signals $\{Ei\}_t$ from being revised on the basis of the above-mentioned oscillation components other than the involved distortion in the case of base clip operation of the base clip circuit being applied ($\beta_t > 0$).

The constant S applied to the comparator 415 is a threshold value for bi-leveling the control signal $\beta_t$, and in the case of a small base clip width, by setting this value it is also possible to control preferentially for the distortion elimination by applying a multiplier constant a to the multiplier 405.

Figure 15:
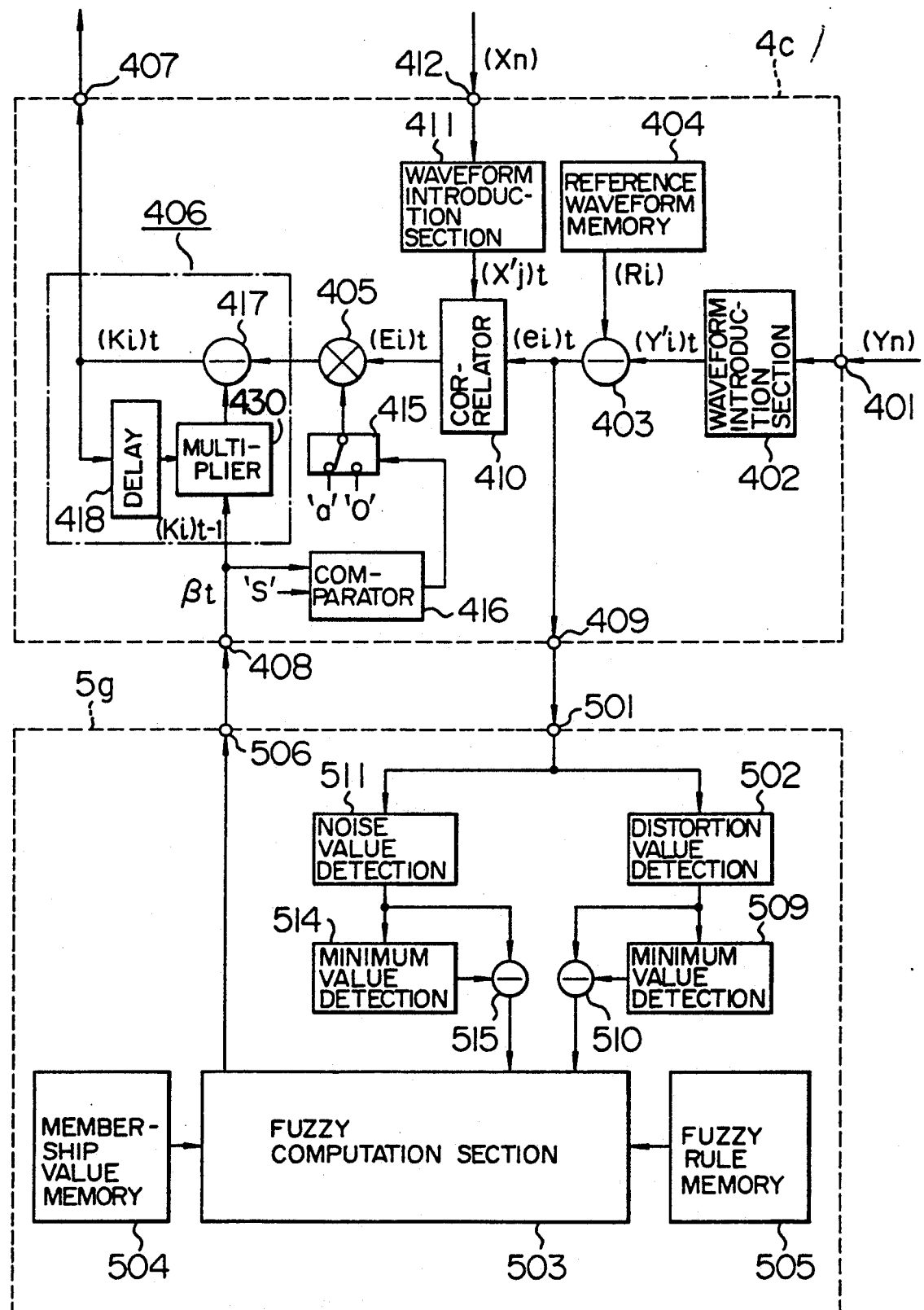
FIGS. 15, 16, 17 and 18 show modifications of the arrangements shown in FIGS. 2, 6 and 11.

It is also possible to replace the base clip circuit 419 with a multiplier 430 so that the control signal. $\beta_t$ is multiplied by the tap coefficient $\{Ki\}_t$, as shown in FIG. 15. This makes possible to reduce the tap coefficient when the device control loop becomes unstable, thereby to suppress growth of random phase tap coefficient through the use of control rules, such as: "if distortion much increases relative to its minimum value and noise much increases relative to its minimum value, then control signal $\beta_t$ is decreased", or "if distortion increases moderately relative to its minimum value and noise increases moderately relative to its minimum value, then control signal $\beta_t$ is made moderate" or "if distortion does not virtually increase relative to its minimum value and noise does not virtually increase relative to its minimum value, then control signal $\beta_t$ is made virtually 1".

It is apparently possible to organize rules by combining the parameters of the foregoing embodiments thereby to control the ghost elimination operation, and in the case more flexible control rules can be accomplished by virtue of the increased number of parameters for checking controlled states.

Next, still another embodiment of the controller 4 and fuzzy inference section 5, which form the transmission distortion elimination device of FIG. 1, will be described with reference to FIG. 12. In the figure, indicated by 4d is a controller, 5i is a fuzzy inference section, 420 and 421 are multipliers, 422 and 423 are input terminals of correction coefficients received from the fuzzy computation section 5i, 409 is an output terminal for delivering data to the fuzzy inference section 5i, 516 and 521 are distortion value detection circuits for the parameter extraction, 517 and 522 are fuzzy computation sections, 518 and 523 are membership value memories, 519 and 524 are fuzzy rule memories, 520 and 525 are output terminals for delivering the correction coefficients to the controller 4d, and the rest are the same as the preceding embodiments.

The error signals $\{ei\}_t$ detected by the controller 4d are fed to one input of the correlator 410 and to the input terminal 501 of the fuzzy inference section 5h by way of the output terminal 409 of the controller 4d, as in the preceding embodiment.

The correlator 410 operates identically to the preceding embodiment to evaluate a set of tap correction signals $\{Ei\}_t$, and the signals are divided into two output groups of $\{El\}_t$ and $\{Em\}_t$. The first group of tap correction signals $\{El\}_t$ are delivered for control of the taps of the non-recursive filter and the second group of tap correction signals $\{Em\}_t$ are delivered for control the taps of the recursive filter. The signals $\{El\}_t$ are fed to one input of the multiplier 420, and the signals $\{Em\}_t$ are fed to one input of the multiplier 421.

The error signals $\{ei\}_t$ produced on the output terminal 409 of the controller 4d are delivered to the distortion value detection circuits 516 and 521 by way of the input terminal 501 of the fuzzy inference section $5_h$. The detection circuit 516 introduces, from the incoming error signals $\{ei\}_t$, error signals $\{el\}_t$ for the taps of the non-recursive filter. The circuit 516 calculates the square-sum of the amplitude values of the introduced error signals over a signal range over which the taps of the non-recursive filter are disposed. From the calculation of the square-sum the distortion value is detected and outputted to the fuzzy computation section 517. The distortion value detection circuit 521 introduces, from the incoming error signals $\{ei\}_t$, error signals $\{em\}_t$ for taps of the recursive filter. Thus the circuit 521 calculates the square-sum of the amplitude values of the introduced error signals over a signal range over which the taps of the recursive filter are disposed From the calculation the distortion value is detected over the signal range and outputted to the fuzzy computation section 522.

The fuzzy computation section 517 reads out each of the control rules stored in the fuzzy rule memory 519, as in the previous embodiment, introduces from the membership value memory 518 a membership value expressed by fuzzy set for the meaning of such ambiguous wording as "large" described in each rule, and implements each inference based on the max-min composition method and defuzzification based on the center of gravity method, for example.

The fuzzy computation section 517 delivers the correction value of each tap coefficient settled by the defuzzification as a correction factor $a_{2t}$, and it is delivered to another input of the multiplier 420 by way of the output terminal 520 of the fuzzy computation section 5h and the input terminal 422 of the controller 4d.

The fuzzy computation section 522 reads out each of the control rules stored in the fuzzy rule memory 524, as in the previous embodiment, introduces from the membership value memory 523 a membership value expressed by fuzzy set for the meaning of such ambiguous wording as "large" described in each rule, and implements each inference based on the max-min composition method and defuzzification based on the center of gravity method, for example.

The fuzzy computation section 522 delivers the correction value of tap coefficients settled by the defuzzification as a correction factor $a_{1t}$, and it is delivered to another input of the multiplier 421 by way of the output terminal 525 of the fuzzy computation section 5h and the input terminal 423 of the controller 4d.

Accordingly, the multiplier 420 produces on its output the amplitude values of tap correction signals $\{El\}_t$ over the signal range defined by the taps of the non-recursive filter which amplitude values are multiplied by the correction coefficient $a_{2t}$. The multiplier 421 produces on its output the amplitude values of tap correction signals $\{Em\}_t$ over the range defined by the taps of the recursive filter which amplitude values are multiplied by the correction coefficient $a_{1t}$.

The tap coefficient revision section 406 preserves the tap coefficient $\{Ki\}_{t-1}$ of the (t−1)th correction, and the t-th tap coefficient revision is implemented by adding the $a_{2t}\{El\}_t$ produced by the multiplier 420 to the tap coefficient to be given to the non-recursive filter, and adding the $a_{1t}\{Em\}_t$ produced by the multiplier 421 to the tap coefficient to be given to the recursive filter. The revised tap coefficient $\{Ki\}_t$ is delivered to the filter section 2 by way of the output terminal 407 of the controller 4d.

According to this embodiment, it is possible to control the correction values of tap coefficients of the non-recursive filter and those of the recursive filter independently, which allows the optimization of the correction values of tap coefficients to each filter. Accordingly, in case the range of distortion of which elimination is shared by the non-recursive filter includes much distortion and the range of distortion of which is shared by the recursive filter includes little distortion, it is possible to set a large correction value of tap coefficient for the non-recursive filter and a small correction value of tap coefficient for the recursive filter, respectively whereby setting of tap coefficient correction values can be suppressed for unnecessary taps in a less distortion region.

Another advantage is the enhanced latitude or flexibility of distortion elimination controls owing to the independent setting of control rules and membership values for the non-recursive filter and the recursive filter respectively.

Although the foregoing embodiment is the case of using the distortion value as the control parameter, it is also possible to have such controls based on the control parameter of the previous embodiments or a combination of their parameters. It is alternatively possible to use control means applying the correction values for the correction coefficient ranging from −1 to 1, and in the case more flexible control rules can be established.

It is further possible to use different control parameters for the controls of the non-recursive filter and of the recursive filter.

Figure 13:
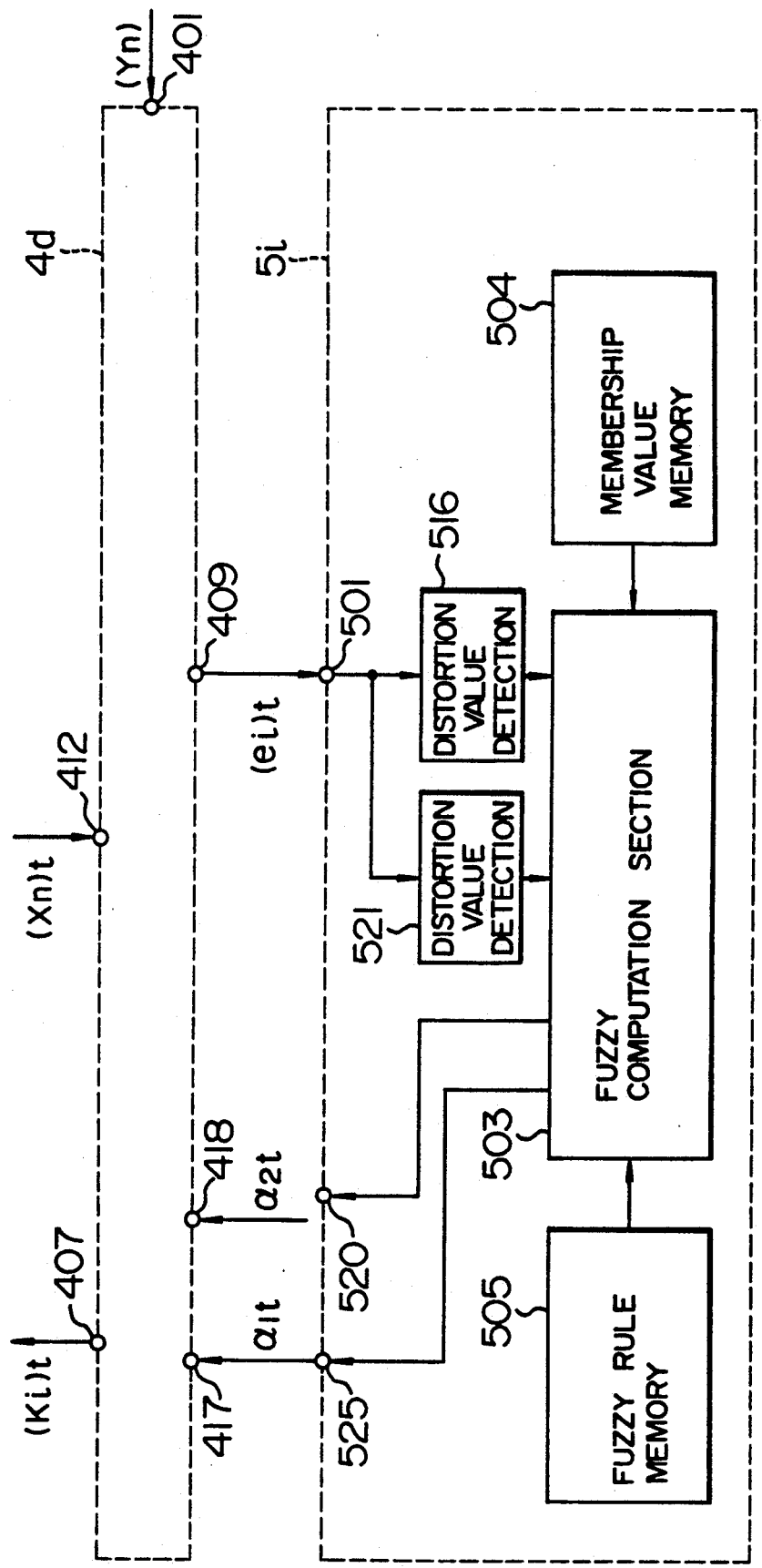

Next, another embodiment of the controller 4 and fuzzy inference section 5, which form the transmission distortion elimination device of FIG. 1, will be described with reference to FIG. 13.

Figure 12:
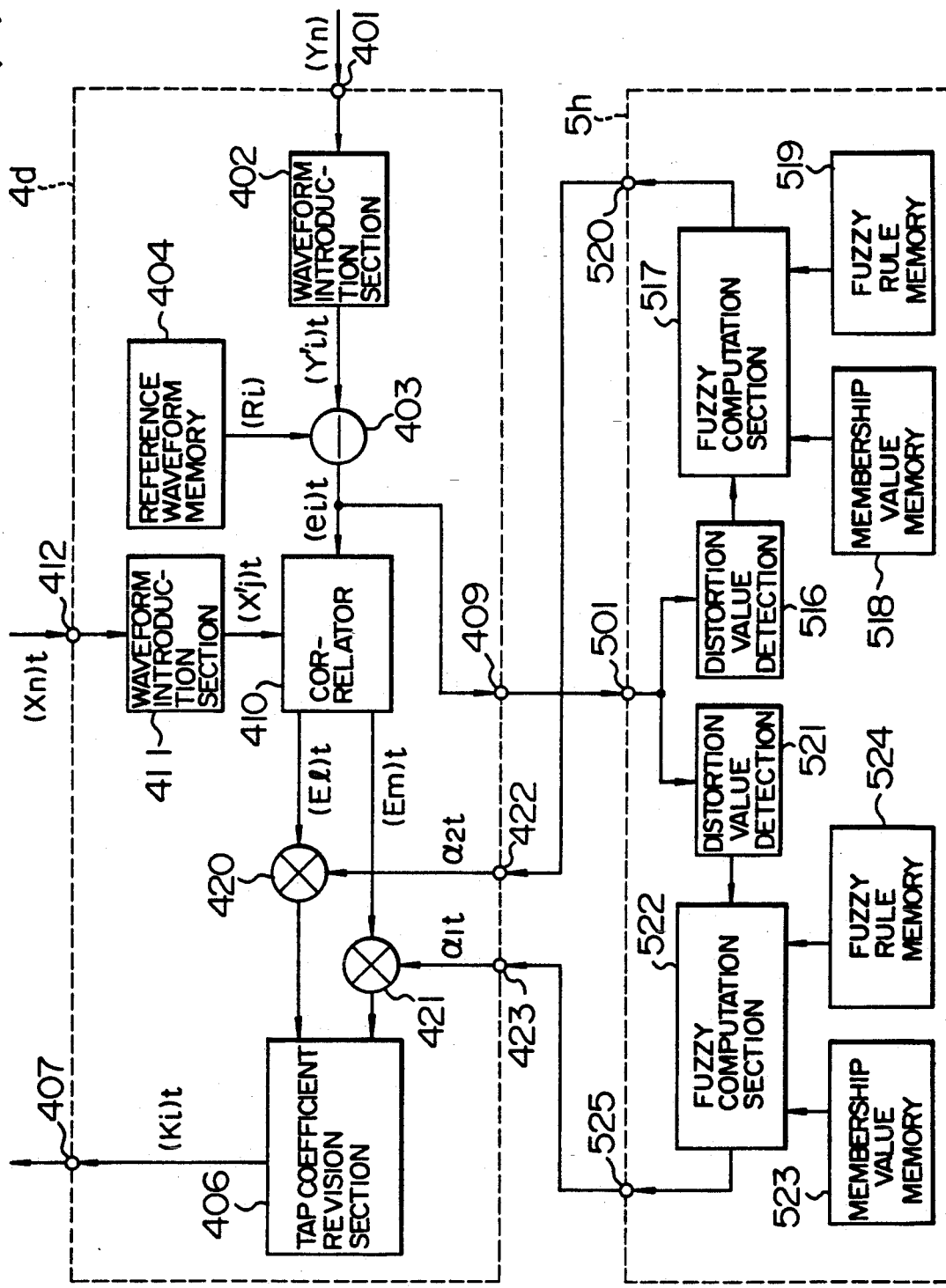

This embodiment is arranged by partially modifying the preceding embodiment of FIG. 12, with the fuzzy computation section being made common, and the distortion values obtained by the distortion value detection circuits 516 and 521 are delivered to the fuzzy computation section 503.

The fuzzy computation section 503 reads out each of the control rules stored in the fuzzy rule memory 524, as in the previous embodiment, introduces from the membership value memory 504 a membership value expressed by fuzzy set for the meaning of such ambiguous wording as "large" described in the rule, implements each inference for the correction value of tap coefficient to be applied to the non-recursive filter and the recursive filter respectively, and delivers the inference results through defuzzification process as correction factors $a_{1t}$ and $a_{2t}$ to the controller 4d through the output terminals 520 and 525.

Based on the correction coefficients $a_{1t}$ and $a_{2t}$ resulting from the above process, the correction values of tap coefficients are determined for the non-recursive filter section and for the recursive filter section, as in the embodiment of FIG. 12, and the respective tap coefficient revision is implemented.

According to this embodiment, the distortion values of the non-recursive filter section and the recursive filter section are processed by the same fuzzy computation section, and it becomes possible to organize control rules in which these distortion values are related to each other. For example, it is possible to establish rules, such as: "if distortion value of non-recursive filter section is large and distortion value of recursive filter section is small, then the correction value of non-recursive filter section is increased and correction value of recursive filter section is decreased", or "if distortion value of non-recursive filter section is large and distortion value of recursive filter section is large, then the correction value of non-recursive filter section is increased and correction value of recursive filter section is decreased" (in order to quickly eliminate distortion of short delay time), whereby it becomes possible to optimize the correction values of tap coefficients in view of the state of distortion with respect to each filter.

Figure 11:
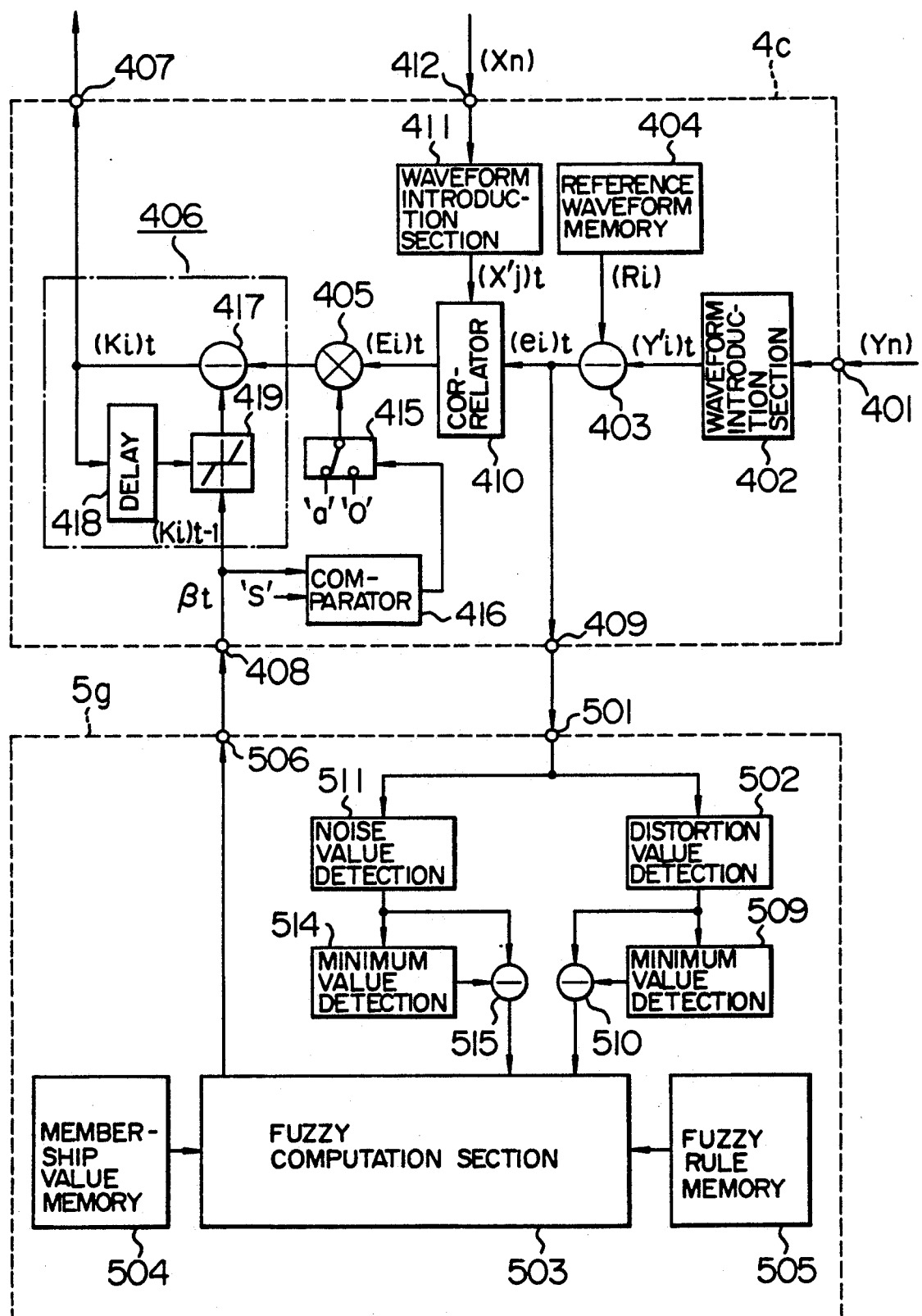
Figure 16:
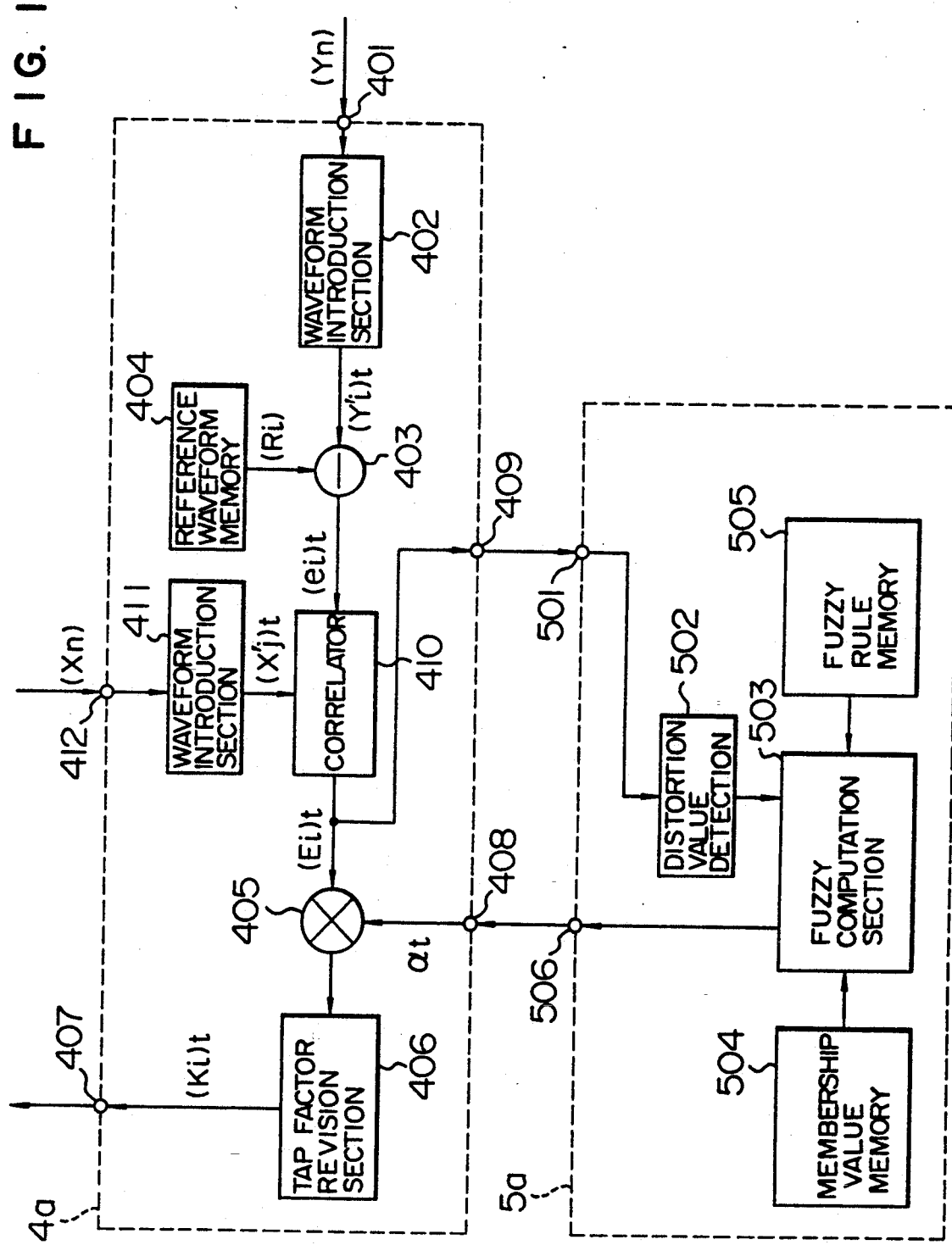
Figure 17:
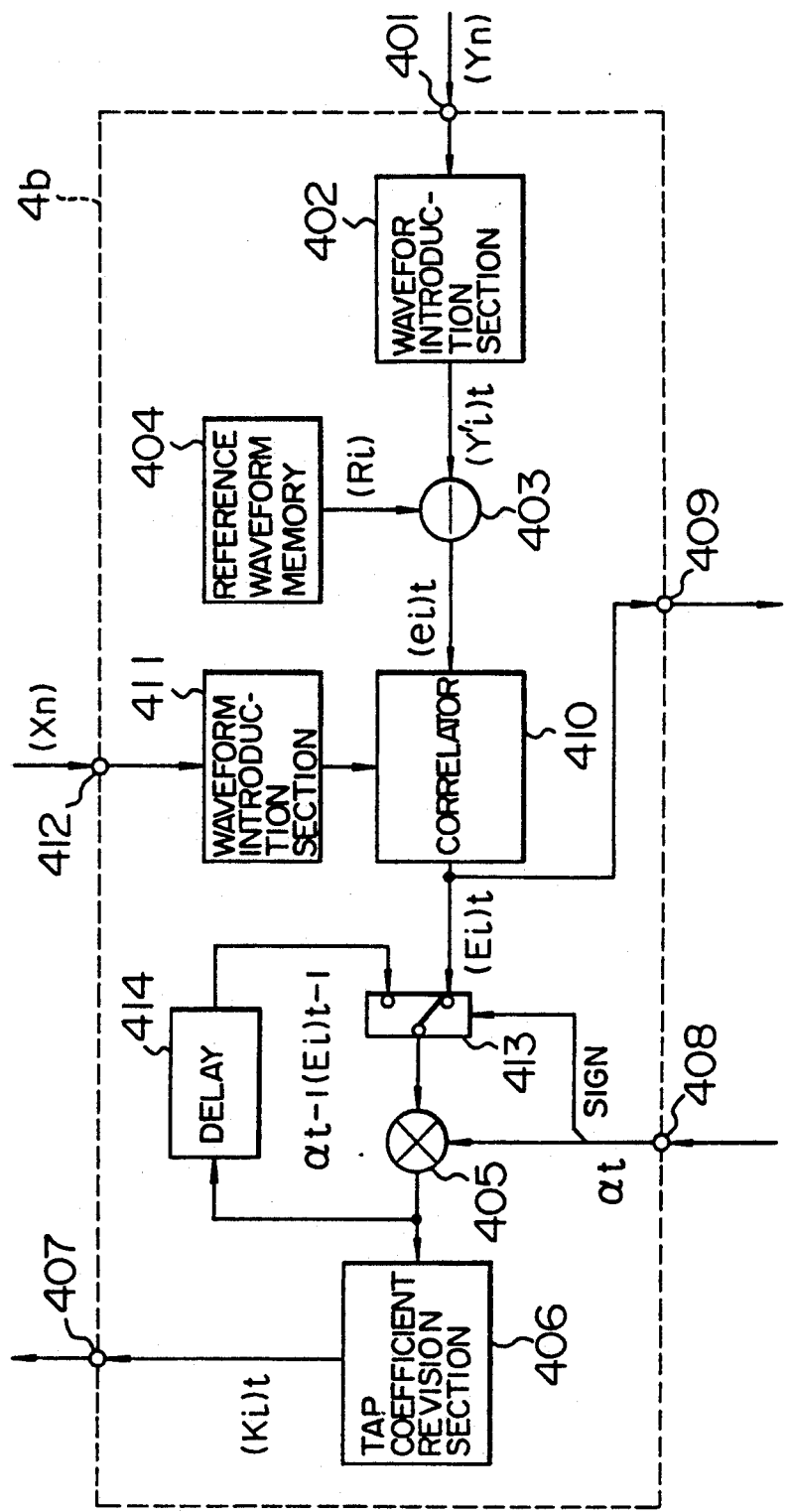
Figure 18:
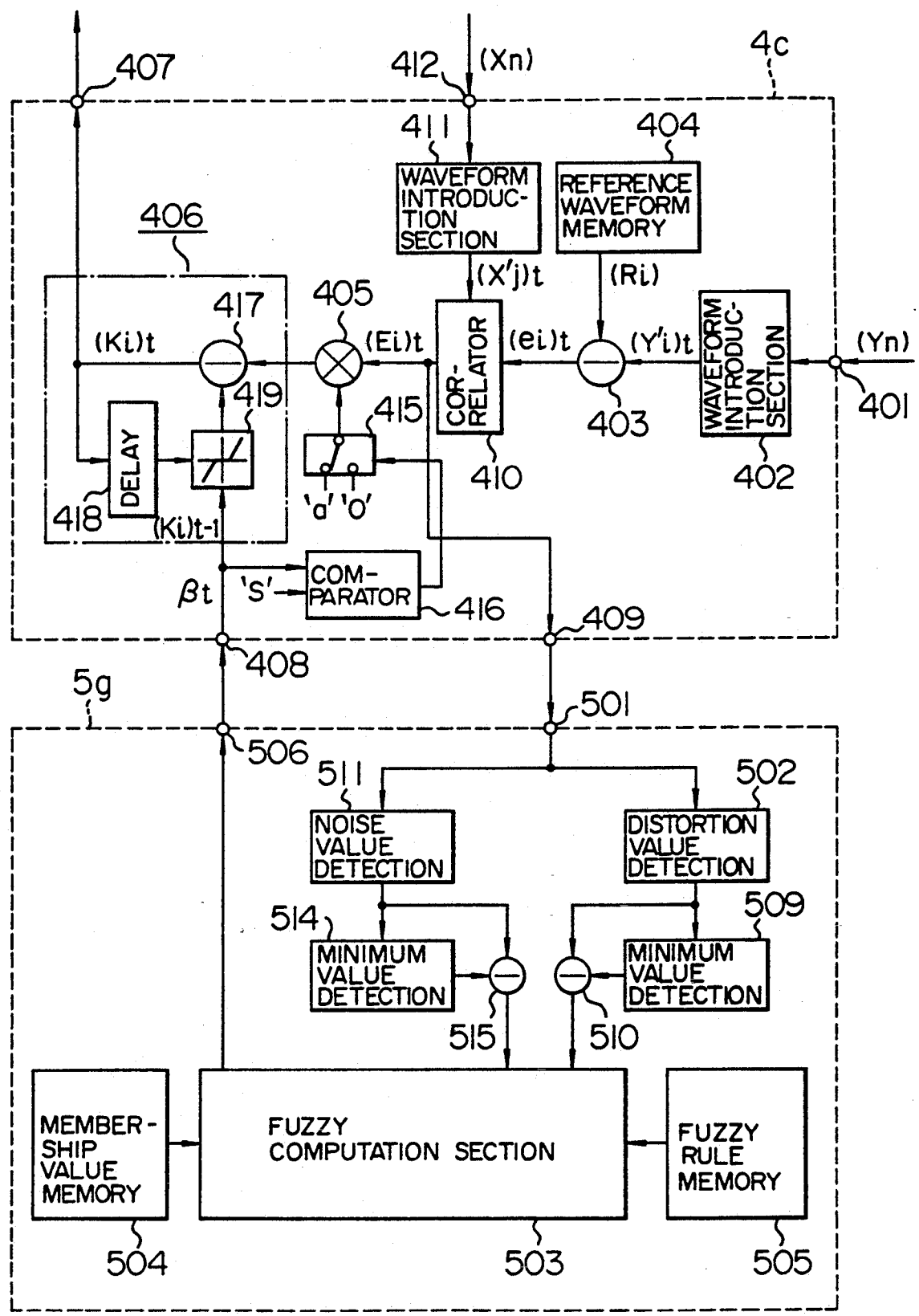

Although the above illustrated embodiments show the connection of the output of the error signal detection means to the fuzzy inference section 5, it is also possible to connect the output of the correlator 410 to the fuzzy inference section 5 as shown in FIGS. 16, 17 and 18 (which correspond, respectively, to modified versions of FIGS. 2, 6 and 11).

Although the foregoing embodiment is the case of using the distortion value as a control parameter, it is also possible to have controls based on the control parameters of the previous embodiments or a combination of their parameters. It is alternatively possible to use control means applying the correction value for the correction coefficient ranging from −1 to 1, and in the case more flexible control rules can be established.

It is apparent from the flowchart of process for the embodiment of FIG. 2 (FIG. 14) that the foregoing embodiments can be carried out on a software basis.

Although the above explanation is the case where the tap correction signals $\{Ei\}_t$ are evaluated by the correlation operation between the reference signals $\{X'j\}_t$ and error signals $\{ei\}_t$, the tap correction signals $\{Ei\}_t$ may be evaluated based on the ZF method. In this case, {Ei}$_t$ may be equal to {ei}$_t$, and therefore the waveform introduction section 411 and correlator 410 can be eliminated, whereby the circuit scale can be reduced in the case of hardware design or the process can be sped up in the case of software design.

Although the above explanation is made on the case of using error signals {ei}$_t$ for the extraction of the parameters to implement the inference of correction coefficient $a_t$, it is also possible to implement the inference of the correction coefficient by using the tap correction signals {Ei}$_t$. This is apparent from the fact that the tap correction signals {Ei}$_t$ are also of information having the delay time and magnitude of distortion.

Although the above explanation is the case of the max-min composition method for inference and the center of gravity method for defuzzification, other methods such the algebraic product-sum method for inference and the height method for defuzzification can be applied.

The reference signal used in the foregoing embodiments is not limited to the GCR signal which is transmitted in 8-field sequence, but they can apparently be applicable with reference signals of different signal waveforms.

Although the foregoing embodiments are ghost elimination devices intended to overcome the ghost interference in the ground broadcasting system, this invention is equally applicable to an automatic waveform equalizing device in which a reference signal is multiplexed on a television signal at the transmission station and the transmission characteristics is improved based on the reference signal. The reference signal waveform is not limited in the case.

According to the inventive transmission distortion elimination device, the correction values of continuously variable tap coefficients can be evaluated based on fuzzy inference by using as the parameters the distortion values of transmission path and system, the amount of distortion change caused during the distortion elimination process and the noise value, whereby the transmission distortion elimination operation which is fast in settlement, stable and flexible can be accomplished. The control method against disturbing coefficients instabilizing device control system can be described in rules in the IF-THEN form based on the fuzzy level, whereby the control algorithm can be organized easily.

Through the provision of a fuzzy computation section, which makes inferences for the correction coefficient adjusted numerically in the range from $-1$ to 1, and corresponding correction means of tap coefficients, it is possible to make further stable and flexible the transmission distortion elimination operation when the amount of change of distortion is adopted for the control parameter.

By using such correction means as the abovementioned base clip not only for the determination of t-th correction value, but also for the (t-1)-th tap coefficient, a control based on fuzzy inference can be applied with further enhanced stability.

Moreover, the tap correction value can be controlled separately for the non-recursive filter section and the recursive filter section, whereby the latitude of control can be enhanced.

We claim:

1. A ghost canceller for eliminating signal distortion components, such as ghost superimposed on a TV signal, of a signal transmission path, said ghost canceller including:

a filter section comprising transversal filter means for receiving the TV signal and having controllable tap coefficients for suppressing the signal distortion components such as ghost possibly contained in the TV signal in order to produce a filtered output signal;

a controller for controlling said tap coefficients of said filter section, said controller storing a predetermined reference signal for comparing therewith thee filtered output signal from said filter section in order to produce possible suppression error data therebetween; and a fuzzy inference section for receiving said error data from said controller and producing a signal of tap coefficient correction by a fuzzy inference on the received error data, thereby enabling said controller to control said tap coefficients of said filter section in response to said signal of tap coefficient correction.

2. A ghost canceller using fuzzy control for eliminating from a transmitted television signal, distortion of the signal such as ghost generated in a transmission path of the signal, said canceller comprising:

a filter section, including transversal filters controllable with tap coefficients, for suppressing the distortion of the television signal such as ghost of the television signal and for outputting a distortion-suppressed TV output signal;

a controller for receiving the distortion-suppressed TV output signal from said filter section, for extracting therefrom data representative of distortion still possibly unsuppressed in the received TV output signal and for controlling the tap coefficients of said transversal filter dependently upon the extracted data of unsuppressed distortion and an input correction value; and a fuzzy inference section for extracting a control parameter from the data of unsuppressed distortion extracted by said controller and for storing therein control rules and membership functions of said control parameter to effect a fuzzy inference operation on said control parameter to infer said input correction value to be input to said controller, wherein said membership functions determine a grade of adaptation of the control parameter for each control rule.

3. A ghost canceller using fuzzy control according to claim 2, wherein said controller comprises:

waveform introduction means for introducing a reference signal portion for eliminating transmission distortion from a distortion-suppressed television signal outputted from said filter section;

a reference waveform memory storing a reference waveform indicative of a transmission characteristic of an ideal transmission path;

error signal detection means for evaluating to output a signal of the difference between the reference signal introduced by said waveform introduction means and the reference waveform signal outputted from said reference waveform memory;

a multiplier having two input terminals one of which receives the evaluation output signal of said error signal detection means; and tap coefficient revision means for revising the tap coefficients of said filters in response to output signal of said multiplier: and wherein said fuzzy inference section comprises:

parameter extraction means for extracting a control parameter for the inference operation of said inference section;

a fuzzy rule memory storing said control rules;

a membership value memory storing said membership functions; and a fuzzy computation section for receiving the control parameter from said parameter extraction means, reading said fuzzy rule memory and said membership value memory, and thereby inferring to output the correction value for the tap coefficients to the other input of said multiplier.

4. A ghost canceller using fuzzy control according to claim 2, wherein said controller comprises:

first waveform introduction means for introducing a reference signal portion for eliminating transmission distortion from a distortion-suppressed television signal outputted from said filter section;

a reference waveform memory storing a reference waveform indicative of a transmission characteristic an ideal transmission path;

error signal detection means for outputting a signal indicative of the difference between the reference signal introduced by said waveform introduction means the reference waveform signal outputted from said reference waveform memory;

second waveform introduction means for introducing the reference signal portion for eliminating transmission distortion from the television signal inputted to said filter section; and correlation computation means for producing a correction signal for correcting the tap coefficients by receiving the output of said error signal detection means and the output of said second waveform introduction means, a multiplier having two input terminals one of which receives the correction signal produced by said correlation computation means;

tap coefficients revision means for revising the tap coefficients of said filters in response to output signal of said multiplier: and wherein said fuzzy inference section comprises:

parameter extraction means for extracting a control parameter for the inference operation of said inference section;

a fuzzy rule memory storing said control rules;

a membership value memory storing said membership functions; and a fuzzy computation section for receiving the control parameter from said parameter extraction means, reading said fuzzy rule memory and said membership value memory, and thereby inferring to output the correction value of tap coefficient, to the other input of said multiplier, said fuzzy inference section being adapted to receive and apply to said parameter extraction means one of the evaluation output signal of said error signal detection means and the correction signal produced by said correlation computation means.

5. A ghost canceller using fuzzy control according to claim 4, wherein said parameter extraction means comprises at least distortion value detection means for calculating a square-sum or absolute value sum of amplitude values of signals outputted by said error signal detection means.

6. A ghost canceller using fuzzy control according to claim 5, wherein said parameter extraction means further comprises change value detection means for detecting the difference between the distortion value at a t-th correction and the distortion value at a (t−1)th correction of said distortion value detection means, where t is the number of iteration of correction.

7. A ghost canceller using fuzzy control according to claim 5, wherein said parameter extraction means further comprises minimum value selection means for selecting a minimum value of distortion values outputted by said distortion value detection means.

8. A ghost canceller using fuzzy control according to claim 5, wherein said parameter extraction means further comprises:

maximum value detection means for detecting to output a signal of maximum value of amplitude values of signals outputted by said error signal detection means or said correlation computation means;

noise value detection means for detecting quantity of noise included in the output of said error signal detection means;

a first divider for evaluating the ratio between the output of said distortion value detection means and the output of said maximum value detection means; and a second divider for evaluating the ratio between the output of said noise value detection means and the output of said maximum value detection means, the evaluation outputs of said first and second dividers being delivered to said fuzzy computation section.

9. A ghost canceller using fuzzy control according to claim 5, wherein said parameter extraction means further comprises:

first minimum value selection means for selecting to output of a first signal of minimum value of distortion values outputted by said distortion value detection means;

a first subtracter for evaluating the difference between the output of said distortion value detection means and the output of said first minimum value selection means;

noise value detection means for detecting quantity of noise included in the output of said error signal detection means;

second minimum value selection means for selecting to output a second signal of minimum value of noise values detected by said noise value detection means; and a second subtracter for evaluating the difference between the output of said noise value detection means and the output of said second minimum value selection means, at least the evaluation outputs of said first and second subtracters being delivered to said fuzzy computation section.

10. A ghost canceller using fuzzy control according to claim 5, wherein said parameter extraction means further comprises:

maximum value detection means for detecting to output a signal of maximum value of amplitude values or signals outputted by said correlation computation means;

noise value detection means for detecting quantity of noise included in the output of said error signal detection means or said correlation computation means;

a first divider for evaluating the ration between the output of said distortion value detection means and the output of said maximum value detection means; and a second divider for evaluating the ration between the output of said noise value detection means and the output of said maximum value detection means, the evaluation outputs of said first and second dividers being delivered to said fuzzy computation section.

11. A ghost canceller using fuzzy control according to claim 5, wherein said parameter extraction means further comprises:

first minimum value selection means for selecting to output of a first signal of minimum value of distortion values outputted by said distortion value detection means;

a first subtracter for evaluating the difference between the output of said distortion value detection means and the output of said first minimum value selection means;

noise value detection means for detecting quantity of noise included in the output of said correlation computation means;

second minimum value selection means for selecting to output a second signal of minimum value of noise values detected by said noise value detection means; and a second subtracter for evaluating the difference between the output of said noise value detection means and the output of said second minimum value selection means, at least the evaluation outputs of said first and second subtracters being delivered to said fuzzy computation section.

12. A ghost canceller using fuzzy control according to claim 4, wherein said parameter extraction means comprises at least maximum value detection means for detecting a maximum value of amplitude values of signals outputted by said error signal detection means 13. A ghost canceller using fuzzy control according to claim 4, wherein said parameter extraction means comprises at least noise value detection means for detecting quantity of noise included in the output of said error signal detection means.

14. A ghost canceller using fuzzy control according to claim 4, wherein said controller includes:

a switch circuit having a first input terminal for receiving the output of said multiplier, and for delivering a switched output to said multiplier; and a delay circuit which receives the output of said multiplier, wherein the output of said error signal detection means is delivered to said fuzzy inference section, the output of said fuzzy inference section is delivered to the other input terminal of said multiplier, the output of said delay circuit is delivered to a second input terminal of said switch circuit, whereby said switch circuit is controlled in response to the sign of the inferenced output of said fuzzy inference section.

15. A ghost canceller using fuzzy inference according to claim 4, wherein said controller includes:

a subtracter having two input terminals and one output terminal, one of said input terminals being connected to an output terminal of said multiplier;

tap coefficient delay means having two input terminals and an output terminal, one of said input terminals being connected to said output terminal of said subtracter; and base clip means having one input terminal connected to said output terminal of said delay means, output terminal connected to said other input terminal of said subtracter, and control terminal for controlling base clipping width to control said subtracter, said control terminal being controlled by said correction value applied from said fuzzy inference section; whereby the tap coefficients of said filter section are controlled in response to the subtraction output of said subtracter.

16. A ghost canceller using fuzzy control according to claim 15, wherein said base clip means is formed of a second multiplier receiving the delayed output of said tap coefficient delay means, and outputting to said other input of said subtracter.

17. A ghost canceller according to claim 4, wherein said parameter extraction means comprises a distortion value detection circuit.

18. A ghost canceller using fuzzy control according to claim 4, wherein said parameter extraction means comprises at least distortion value detection means for calculating a square-sum or absolute value sum of amplitude values of signals outputted by said correlation computation means.

19. A ghost canceller using fuzzy control according to claim 4, wherein said parameter extraction means comprises at least maximum value detection means for detecting a maximum value of amplitudes values of signals outputted by said correlation computation means.

20. A ghost canceller using fuzzy control according to claim 4, wherein said parameter extraction means comprises at least noise value detection means for detecting quantity of noise included in the output of said correlation computation means.

21. A ghost canceller using fuzzy control according to claim 4, wherein said controller includes:

a switch circuit having a first input terminal for receiving the output of said correlation computation means, and for delivering a switched output to said multiplier; and a delay circuit which receives the output of said multiplier, wherein the output of said correlation computation means is delivered to said fuzzy inference section, the output of said fuzzy inference section is delivered to the other input terminal of said multiplier, the output of said delay circuit is delivered to a second input terminal of said switch circuit, whereby said switch circuit is controlled in response to the sign of the inferenced output of said fuzzy inference section.

22. A ghost canceller according to claim 2, wherein said transversal filters include a non-recursive transversal filter and a recursive transversal filter; wherein said controller comprises means for extracting a first portion of said data representative of unsuppressed distortion and controlling tap coefficients of said non-recursive transversal filter dependently upon said first portion of said data of unsuppressed distortion and a first input correction value, and means for extracting a second portion of said data representative of unsuppressed distortion and controlling tap coefficients of said recursive transversal filter dependently upon said second portion of said data of unsuppressed distortion and a second input correction value; and said fuzzy inference section comprises first and second sections for inferring said first input correction value and second input correction value, respectively.

23. A ghost canceller using fuzzy control according to claim 22, wherein said fuzzy inference section comprises:

parameter extraction means for extracting a control parameter for the inference operations of said inference section to infer said first and second correction values for the tap coefficients of said non-recursive filter and said recursive filter respectively;

a fuzzy rule memory storing said control rules;

a membership value memory storing said membership functions; and a fuzzy computation section for receiving the control parameter from said parameter extraction means, reading said fuzzy rule memory and said membership value memory, and thereby inferring said first or second correction value for the tap coefficients.

24. A ghost canceller according to claim 23, wherein said parameter extraction means comprises a distortion value detection circuit.

25. A ghost canceller using fuzzy control according to claim 22, wherein said fuzzy inference section comprises:

first parameter extraction means for extracting a first control parameter to be used for the inference of the first correction value for the coefficients of said non-recursive filter;

second parameter extraction means for extracting a second control parameter to be used for the inference of the second correction value for the coefficients of said recursive filter;

a fuzzy rule memory storing said control rules;

a membership value memory storing said membership functions; and a fuzzy computation section for receiving said first and the second correction parameters, reading said fuzzy rule memory and said membership value memory, and thereby inferring said first and said second correction values for the tap coefficients.

26. A ghost canceller according to claim 25, wherein said parameter extraction means comprises a distortion value detection circuit.

* * * * *